(12) United States Patent
Noguchi et al.

(10) Patent No.: US 7,430,693 B2
(45) Date of Patent: Sep. 30, 2008

(54) DATA MEMORY SYSTEM

(75) Inventors: Mitsuhiro Noguchi, Yokohama (JP); Akira Goda, Tokushima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 710 days.

(21) Appl. No.: 11/055,782

(22) Filed: Feb. 11, 2005

(65) Prior Publication Data

US 2005/0204212 A1    Sep. 15, 2005

(30) Foreign Application Priority Data

Feb. 27, 2004    (JP)    ............................. 2004-054532

(51) Int. Cl.
  *G11C 29/00*    (2006.01)
(52) U.S. Cl. ..................... 714/710; 714/718
(58) Field of Classification Search ................ 714/718, 714/710; 365/185.17; 711/703
See application file for complete search history.

(56) References Cited

U.S. PATENT DOCUMENTS

| | | | |
|---|---|---|---|
| 6,201,282 B1 | 3/2001 | Eitan | |
| 6,584,015 B2 | 6/2003 | Katayama et al. | |
| 6,819,590 B2 | 11/2004 | Goda et al. | |
| 7,219,271 B2 * | 5/2007 | Kleveland et al. | ............ 714/718 |
| 2003/0115518 A1 * | 6/2003 | Kleveland et al. | ............ 714/718 |
| 2003/0156454 A1 * | 8/2003 | Wei et al. | ................ 365/185.17 |
| 2004/0257888 A1 | 12/2004 | Noguchi et al. | |
| 2007/0276987 A1 * | 11/2007 | Luo et al. | .................... 711/103 |

FOREIGN PATENT DOCUMENTS

| | | |
|---|---|---|
| JP | 6-187795 | 7/1994 |
| JP | 8-203292 | 8/1996 |
| JP | 3176019 | 4/2001 |
| JP | 2001-273798 | 10/2001 |
| JP | 2002-150783 | 5/2002 |
| KR | 1995-0008789 | 8/1995 |
| WO | WO 97/32253 | 9/1997 |

* cited by examiner

*Primary Examiner*—David Ton
(74) *Attorney, Agent, or Firm*—Oblon, Spivak, McClelland, Maier & Neustadt, P.C.

(57) ABSTRACT

A data memory system includes a non-spare area having a plurality of memory cell blocks and containing pages, a spare area having a plurality of spare memory cell blocks in which data items are previously set to a certain value and containing pages, and a determination circuit which detects a data error of at least two bits when data is read out from the page of the non-spare area and determines the number of error bits in the readout page for each readout page. When the result of determination by the determination circuit indicates two or more bits, the contents of the readout page are error-corrected and programmed into the page of the spare area.

20 Claims, 20 Drawing Sheets

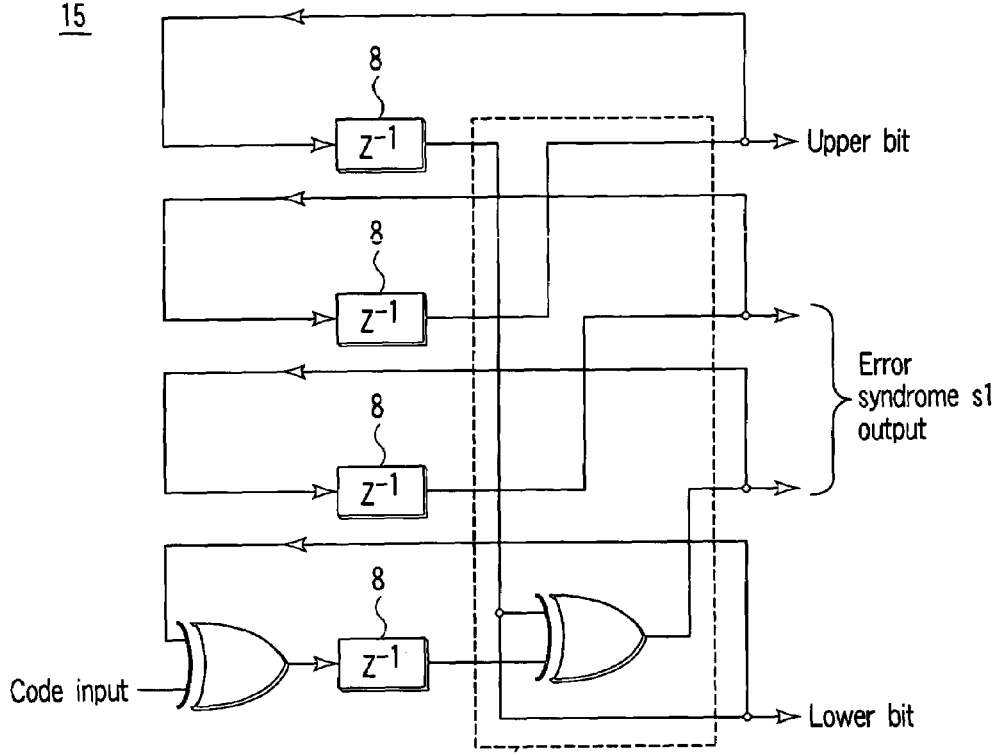
F I G. 9
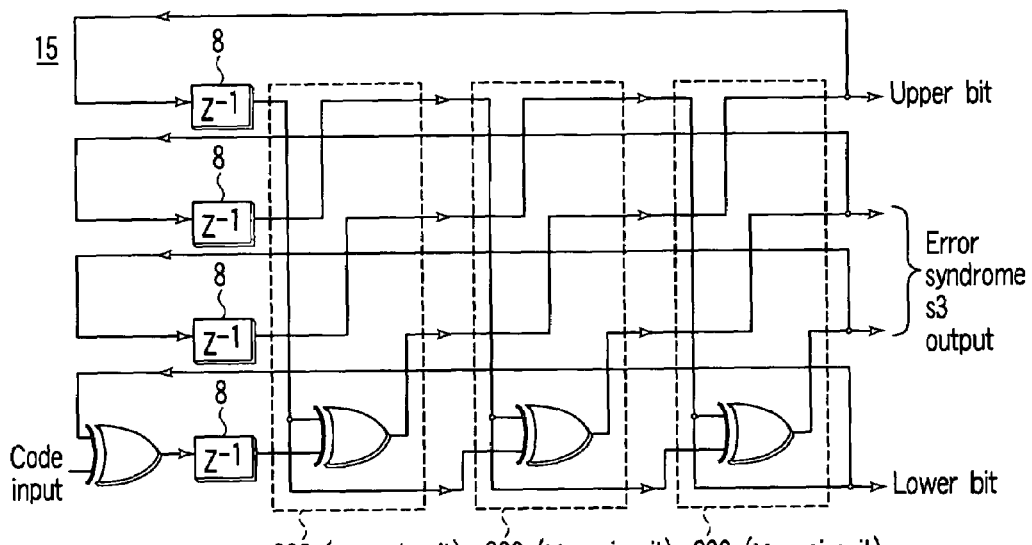
F I G. 10

| Non-spare area block address | | (0 0 0 0 0 0 0 0 0 0 0) ⌇ (0 1 1 1 1 1 1 1 1 1 1) |
|---|---|---|
| Spare area block address (select and use address of low-level class) | Class 0 | (1 1 1 1 1 1 1 1 1 1 1) |
| | Class 1 | (1 1 1 1 1 1 1 1 1 1 0) <br> (1 1 1 1 1 1 1 1 1 0 1) <br> (1 1 1 1 1 1 1 1 0 1 1) <br> (1 1 1 1 1 1 1 0 1 1 1) <br> (1 1 1 1 1 1 0 1 1 1 1) <br> (1 1 1 1 1 0 1 1 1 1 1) <br> (1 1 1 1 0 1 1 1 1 1 1) <br> (1 1 1 0 1 1 1 1 1 1 1) <br> (1 1 0 1 1 1 1 1 1 1 1) <br> (1 0 1 1 1 1 1 1 1 1 1) |
| | Class 2 | (1 1 1 1 1 1 1 1 1 0 0) <br> (1 0 1 1 1 1 1 1 1 1 0) <br> which are obtained by replacing freely selected two bits of "1" in class 0 by "0" |
| | Class 3 | (1 1 1 1 1 1 1 0 0 0) <br> (1 0 1 1 1 1 0 1 1 0) <br> replacing freely selected three bits of "1" in class 0 by "0" |

F I G. 12

| Power representation | Vector representation | Power representation | Vector representation |
|---|---|---|---|
| 0 | (0 0 0 0) | $\alpha^7$ | (1 0 1 1) |
| $\alpha^0$ | (0 0 0 1) | $\alpha^8$ | (0 1 0 1) |
| $\alpha^1$ | (0 0 1 0) | $\alpha^9$ | (1 0 1 0) |
| $\alpha^2$ | (0 1 0 0) | $\alpha^{10}$ | (0 1 1 1) |
| $\alpha^3$ | (1 0 0 0) | $\alpha^{11}$ | (1 1 1 0) |
| $\alpha^4$ | (0 0 1 1) | $\alpha^{12}$ | (1 1 1 1) |
| $\alpha^5$ | (0 1 1 0) | $\alpha^{13}$ | (1 1 0 1) |
| $\alpha^6$ | (1 1 0 0) | $\alpha^{14}$ | (1 0 0 1) |

Example of elements of Galois body ($2^4$) which are error code locators and syndromes of first embodiment

F I G. 13

| Syndrome input [$\alpha^i$ corresponds to power representation and 4-bit representation corresponds to vector representation] | | | | Error position locator output | | | | Output example of error number [a least value (bits) obtained by rounding up fraction of $\log_2(n)$] | Contents (not contained in output bit) |
|---|---|---|---|---|---|---|---|---|---|
| s1 | s3 | ⟩ ⟨ | s2t-1 | First bit | Second bit | ⟩ ⟨ | t-th bit | | |
| 0000 | 0000 | ⟩ ⟨ | 0000 | abcd | abcd | ⟩ ⟨ | abcd | 000 | No error bit |
| $\alpha^i$ | $\alpha^{3i}$ | ⟩ ⟨ | $\alpha^{(2t-1)i}$ | $\alpha^{-i}$ | abcd | ⟩ ⟨ | abcd | 001 | Error bit of one bit |
| $\alpha^i+\alpha^j$ | $\alpha^{3i}+\alpha^{3j}$ | ⟩ ⟨ | $\alpha^{(2t-1)i}+\alpha^{(2t-1)j}$ | $\alpha^{-i}$ | $\alpha^{-j}$ | ⟩ ⟨ | abcd | 010 | Error bit of two bits |
| | | ⟩ ⟨ | | ⟩ ⟨ | | | | | |
| $\alpha^i+\alpha^j+...+\alpha^n$ | $\alpha^{3i}+\alpha^{3j}+...+\alpha^{3n}$ | ⟩ ⟨ | $\alpha^{(2t-1)i}+\alpha^{(2t-1)j}+...+\alpha^{(2t-1)n}$ | $\alpha^{-i}$ | $\alpha^{-j}$ | ⟩ ⟨ | $\alpha^{-n}$ | 110 | Error bit of t [bits] |
| e1 f1 g1 h1 | e2 f2 g2 h2 | ⟩ ⟨ | et ft gt ht | abcd | abcd | ⟩ ⟨ | abcd | 111 | Error bit exceeding t [bits] (which cannot be relieved by use of ECC) | a b c d : desired column address (which may not be set in error position)
(e1 f1 g1 h1 e2 f2 g2 h2, ...et ft gt ht) : syndrome combination other than syndrome combinations of (s1, s3, ..., s2t-1) having error bits equal to or less than t [bits]
i, j, ..., n are integers which are different from one another in range of {(number of elements of Galois body) -1} to 0

FIG. 20

| Syndrome input [$\alpha^i$ corresponds to power representation and 4-bit representation corresponds to vector representation] | | | | Error position locator output | | | | Output example of error number [a least value (bits) obtained by rounding up fraction of $\log_2(n)$] | Contents (not contained in output bit) |
|---|---|---|---|---|---|---|---|---|---|
| s1 | s3 | ~ | s2t-1 | First bit | Second bit | ~ | t-th bit | | |
| 0000 | 0000 | ~ | 0000 | a b c d | a b c d | ~ | a b c d | 000 | No error bit |
| $\alpha^i$ | $\alpha^{3i}$ | ~ | $\alpha^{(2t-1)i}$ | $\beta^i$ | a b c d | ~ | a b c d | 001 | Error bit of one bit |
| $\alpha^i + \alpha^j$ | $\alpha^{3i} + \alpha^{3j}$ | ~ | $\alpha^{(2t-1)i} + \alpha^{(2t-1)j}$ | $\beta^i$ | $\beta^j$ | ~ | a b c d | 010 | Error bit of two bits |
| $\alpha^i + \alpha^j + \ldots + \alpha^n$ | $\alpha^{3i} + \alpha^{3j} + \ldots + \alpha^{3n}$ | ~ | $\alpha^{(2t-1)i} + \alpha^{(2t-1)j} + \ldots + \alpha^{(2t-1)n}$ | $\beta^i$ | $\beta^j$ | ~ | $\beta^n$ | 110 | Error bit of t [bits] |
| e1 f1 g1 h1 | e2 f2 g2 h2 | ~ | et ft gt ht | a b c d | a b c d | ~ | a b c d | 111 | Error bit exceeding t [bits] (which cannot be relieved by use of ECC) | a b c d: Address representation which is larger than maximum value of binary representation value of code length or which becomes (0000) (e1 f1 g1 h1 e2 f2 g2 h2, ...et ft gt ht): syndrome combination other than syndrome combinations of (s1, s3, ..., S2t-1) having error bits equal to or less than t [bits]
i, j, ..., n are integers which are different from one another in range of {(number of elements of Galois body) -1} to 0
$\beta^i, \beta^j, ..., \beta^n$: position locator indicating error position by use of natural binary number

F I G. 22

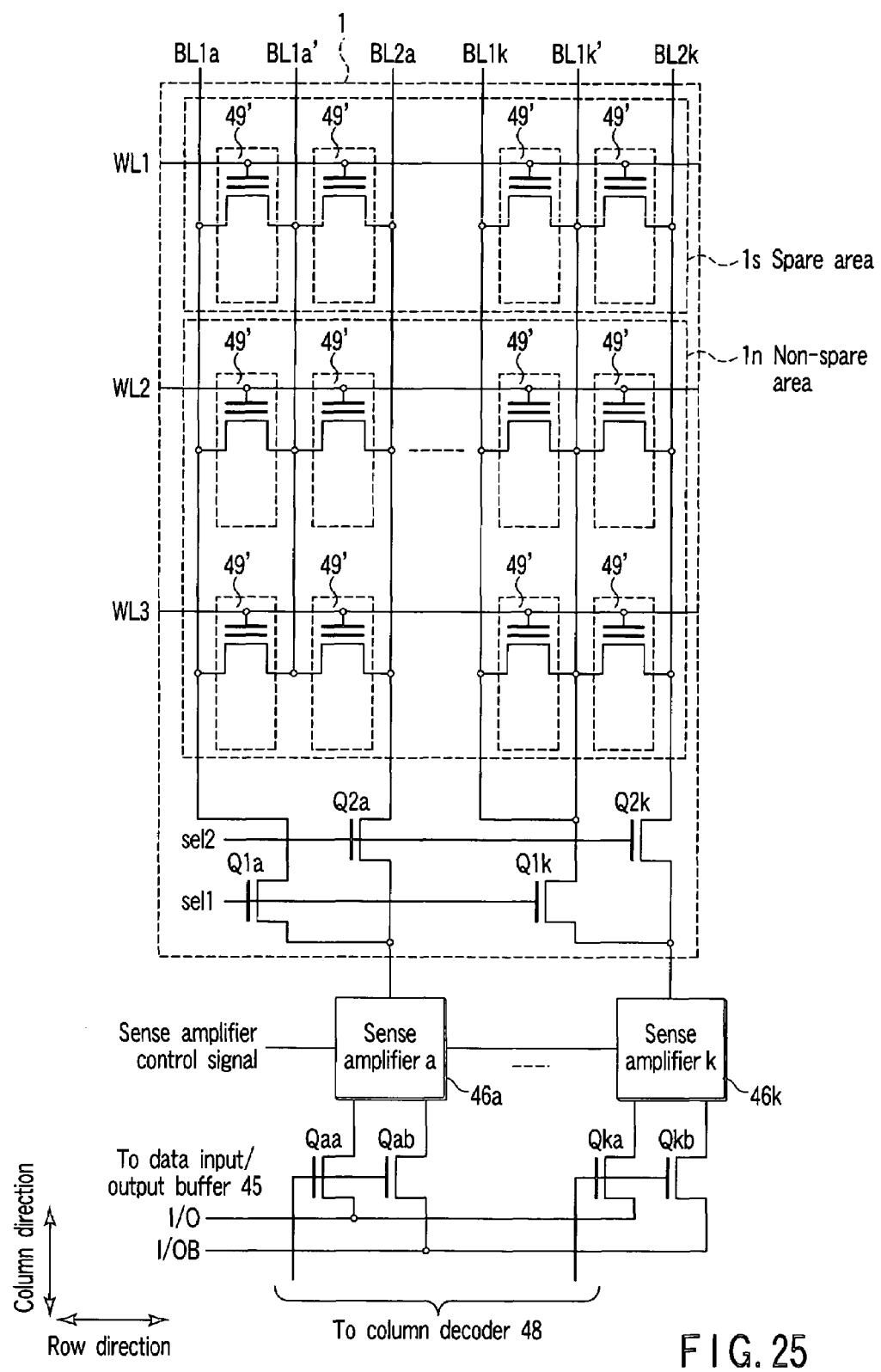
F I G. 25

DATA MEMORY SYSTEM

CROSS-REFERENCE TO RELATED APPLICATIONS

This application is based upon and claims the benefit of priority from prior Japanese Patent Application No. 2004-054532, filed Feb. 27, 2004, the entire contents of which are incorporated herein by reference.

BACKGROUND OF THE INVENTION

1. Field of the Invention

This invention relates to a data memory system, and more particularly to a data memory system having a semiconductor memory which includes an error detection/correction unit.

2. Description of the Related Art

As one of semiconductor memories, a nonvolatile semiconductor memory which stores information according to a charge amount in the charge storage layer, measures a variation in the conductance of a MOSFET according to the charge amount and reads out information is developed. This is a so-called EEPROM.

The EEPROM data readout system is a so-called non-destructive readout system which is not accompanied by destruction of data, unlike the case of a DRAM. That is, the EEPROM permits the data readout operation to be performed a plurality of times without destroying data. However, if the program operation and the erase operation are repeatedly performed, the following states (1) and (2) occur and data is destroyed.

(1) For example, the tunnel insulating film of the EEPROM is degraded, a leakage current increases and the charge holding characteristic is deteriorated.

(2) Charges are trapped in the tunnel insulating film and the threshold voltage of the EEPROM cell is set outside a preset range. Thus, so-called bit destruction occurs. As the memory capacity of the EEPROM increases, the probability that the EEPROM will contain bits subjected to bit destruction (the rate of occurrence of faulty bits) becomes higher. This is true even if the numbers of program operations and erase operations are constant.

One of the measures to counter the bit destruction is described in Japanese Patent Specification No. 3176019 (which is hereinafter referred to as a document 1), for example. The document 1 discloses a technique for reading out a memory cluster configured by a plurality of pages and detecting faulty bits when it is not required to read out data from an external I/O, for example, at the power supply turn ON or OFF time by use of an error detection/correction unit (Error Correction Code circuit: ECC circuit). If errors of a number exceeding the error reference value are detected, whole data items of the memory cluster to be subjected to the ECC process are read out and programmed into another memory area. Thus, the rate of occurrence of faulty bits as viewed from an external interface can be lowered.

Document 1: Japanese Patent Specification 3176019

BRIEF SUMMARY OF THE INVENTION

A data memory system according to a first aspect of the present invention comprises a non-spare area having a plurality of memory cell blocks and containing pages, a spare area having a plurality of spare memory cell blocks in which data items are previously set to a certain value and containing pages, and a determination circuit which detects a data error of at least two bits when data is read out from the page of the non-spare area and determines the number of error bits in the readout page for each readout page, wherein the contents of the readout page are error-corrected and programmed into the page of the spare area when the result of determination by the determination circuit indicates the number of bits not less than two.

A data memory system according to a second aspect of the present invention comprises a non-spare area having $n_{block}$ memory cell blocks and containing pages, a spare area having $n_{replace}$ spare memory cell blocks in which data items are previously set to a certain value and containing pages, and an error correction circuit which corrects errors of ECC bits at maximum for each page, wherein the ECC bits are not less than two bits and the following equations [1] and [2] are obtained when the maximum ensured value of the number of memory cell blocks required to be replaced after a specified maximum number of program and erase operations or at the end time of the product ensured lifetime is set to $n_{bad}$, $$n_{bad} = n_{block} \times \sum_{i=ECC+1}^{\infty} \frac{a^i}{i!}$$

$$n_{replace} \geq n_{block} \times \frac{a^{ECC}}{(ECC)!}$$

the number $n_{replace}$ of the spare memory cell blocks is set to satisfy the equations [1], [2] ("a" is a variable which can be eliminated by simultaneously establishing the equations [1] and [2]), and the contents of the page in which an error bit occurs are error-corrected and programmed into the page of the spare area when the error bit occurs in the page of the non-spare area.

A data memory system according to a third aspect of the present invention comprises a non-spare area having a plurality of memory cell blocks which store binary digital data indicating at least a program state and erase state and containing pages, a spare area having a plurality of spare memory cell blocks which store binary digital data indicating at least a program state and erase state and in which data items are previously set to a certain value and containing pages, and an error correction code circuit which receives a digital data output from the page of the memory cell block and detects a data error of at least two bits, wherein block addresses of the non-spare area are successively set and block addresses of the spare area are set to contain program state bits of a number larger than the number of erase state bits.

BRIEF DESCRIPTION OF THE SEVERAL VIEWS OF THE DRAWING

FIG. 9 is a circuit diagram showing an example of the circuit of a decoder (syndrome calculator) 15 shown in FIG. 7;

FIG. 10 is a circuit diagram showing an example of the circuit of the decoder (syndrome calculator) 15 shown in FIG. 7;

FIG. 12 is a diagram showing an example of assignment of block addresses of the data memory system according to the first embodiment of this invention;

FIG. 13 is a diagram showing elements of a Galois body;

FIG. 20 is a diagram showing an example of the correspondence table between error position locator outputs and syndrome inputs used in the data memory system according to the second embodiment of this invention;

FIG. 22 is a diagram showing an example of the correspondence table between error position locator outputs and syndrome inputs used in the data memory system according to the modification of the second embodiment of this invention;

FIG. 25 is a block diagram showing an example of the configuration of a cell array section and sense amplifier section of a data memory system according to a fourth embodiment of this invention;

DETAILED DESCRIPTION OF THE INVENTION

Figure 1:
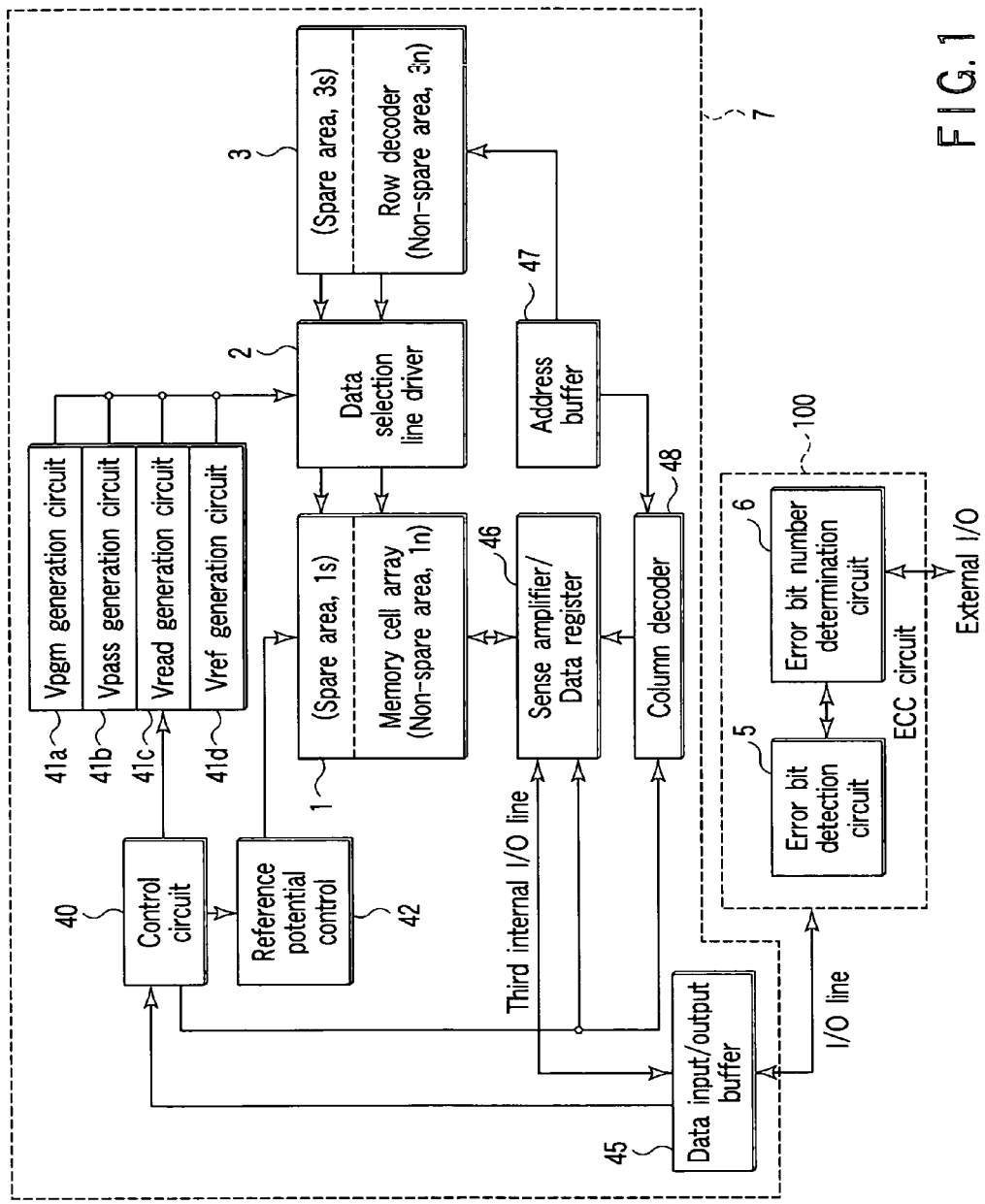
FIG. 1 is a block diagram showing an example of the configuration of a data memory system according to a first embodiment of this invention.

In document 1, a concrete method as to how to select an error reference value is not described. In this case, if the number of bits which can be relieved by use of the ECC circuit is excessively increased, the rate of occurrence of faulty bits as viewed from the external interface is lowered. However, if the number of bits which the ECC circuit can relieve, that is, the number k of error correctable bits is increased, it becomes necessary to derive a solution of an error positional polynomial of k-th degree (on the Galois body) in order to derive the bit position in which faulty bits occur. Therefore, the calculation circuit is complex, calculation time becomes long and the area of the calculation circuit is increased.

Further, in the case of BCH (Bose-Chaudhuri-Hocquenghem) coding, the length of a code containing the ECC bit is set to "n" and the ECC bit is required to contain information indicating the position of an error bit in n bits. Therefore, if the number of bits which can be relieved by use of ECC is increased by one, the number of check bits used by the ECC circuit is increased by at least the number of bits obtained by rounding up a fraction of $\log_2(n)$ to the nearest integer. As a result, the code length becomes longer and the chip area is increased or the number of data bits which can be used by the user is reduced.

Further, in document 1, there is no concrete description about the configuration of the system, for example, the configuration of a vacant memory area. Also, there is no description about the size of the memory area which permits a desired effect to be attained or permits the rate of occurrence of faulty bits as viewed from the external interface to be suppressed while an increase in the chip area is suppressed.

In document 1, there is no disclosure as to how to prepare the vacant memory area and how to replace the memory area in order to perform the replacement operation at high speed.

Further, the vacant memory area is set to be the same area as the data memory area, and it is ensured that the initial capacity of both of the areas is set as the capacity of the data memory area which can be used by the user. Therefore, if faulty bits of a number exceeding the number of bits which the ECC circuit can relieve occur, the size of the data memory area which the user can use is substantially reduced and it is difficult to ensure the degree of a reduction.

A nonvolatile semiconductor memory device disclosed in the embodiment of this invention roughly analyses an ECC (error correcting code) and replaces a page in which faulty bits of at least a specified number larger than one bit occur by a spare page. Thus, the rate of occurrence of faulty bits as viewed from the external interface is reduced without increasing the number of check bits of the ECC circuit even when faulty bits of not less than a specified number occur. Further, processing time required for replacing the page by a spare page can be reduced.

Particularly, vacant memory areas of a certain number or more are previously prepared as a spare area. Thus, it becomes possible to realize a data memory system containing a semiconductor memory which can perform the high-speed replacement operation and attain the criticality which can cause the rate of occurrence of faulty bits as viewed from the external interface to be suppressed while the data memory area which the user can use is ensured until the end of the service lifetime.

There will now be described embodiments of this invention with reference to the accompanying drawings. In this explanation, common reference symbols are attached to like portions throughout the drawings.

First Embodiment

Figure 2:
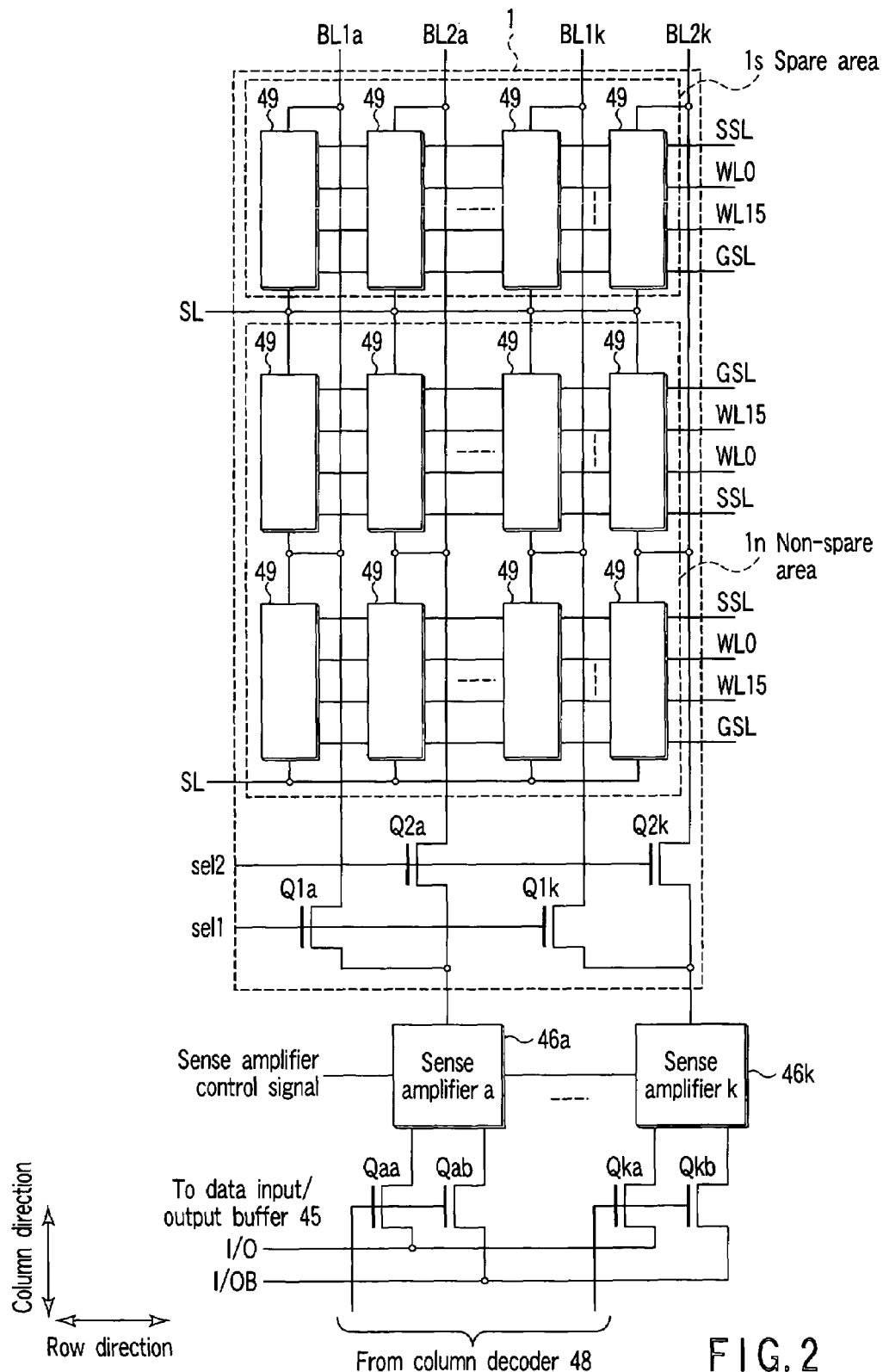
FIG. 2 is a block diagram showing an example of the configuration of a cell array section and sense amplifier section of the data memory system according to the first embodiment of this invention.

FIG. 1 is a block diagram showing an example of the configuration of a data memory system according to a first embodiment of this invention and FIG. 2 is a block diagram showing an example of the configuration of a cell array section and sense amplifier section of the data memory system according to the first embodiment of this invention. In FIG. 1, data selection lines (WL) and block selection lines (SSL, GSL) are omitted.

In this specification, a memory cell block includes a single page or plural pages and indicates a unit of memory cells which are simultaneously subjected to the erase operation. In this case, for example, if the erase time for one page of the memory cells is longer than the program time for one page of memory cells, as in flash memory cells having charge storage layers, the memory cell block may be configured to contain a plurality of pages and permit the erase operation to be simultaneously performed for a plurality of pages. With this configuration, the program time for one block and the erase time for one block can be set approximately equal to each other. Further, the performance of the erase speed and the program data transfer speed as viewed from the system can be enhanced. One example of the concrete configuration of a memory cell block 49 is described below.

Figure 3:
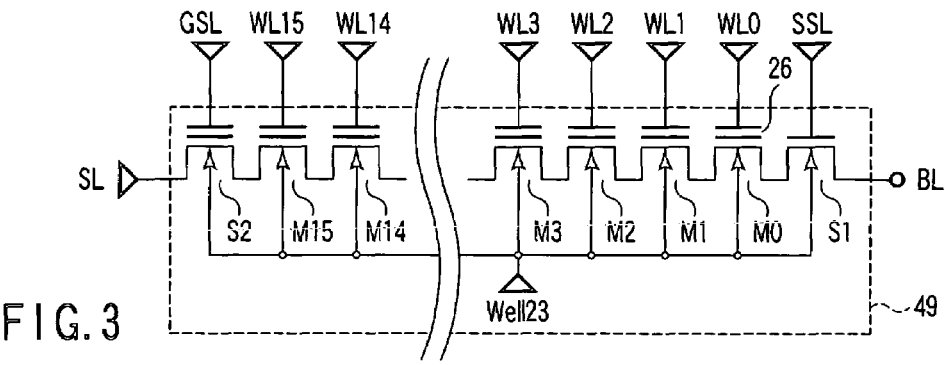
FIG. 3 is an equivalent circuit diagram showing an example of the equivalent circuit of a memory cell block 49 shown in FIG. 2.
Figure 4:
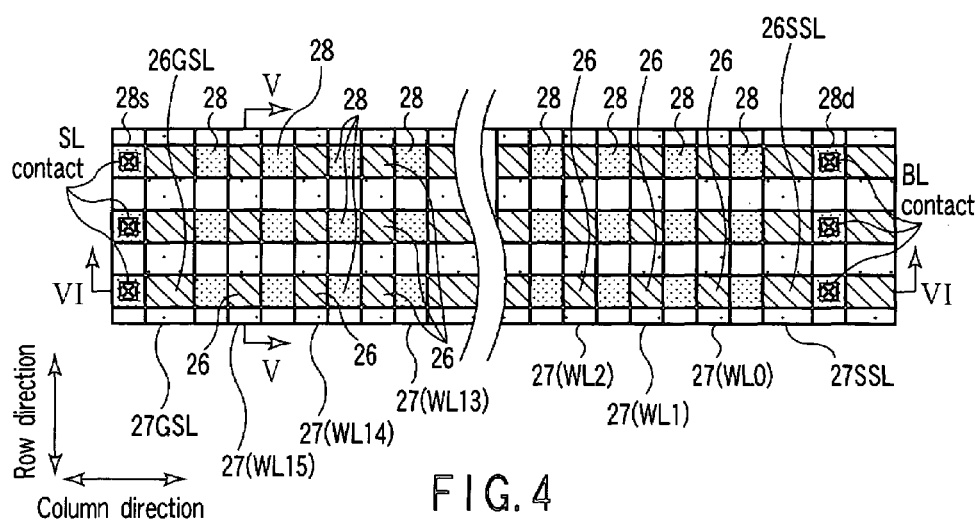
FIG. 4 is a plan view showing an example of the plane pattern of the memory cell block 49 shown in FIG. 2.

FIG. 3 is an equivalent circuit diagram showing an example of the equivalent circuit of the NAND cell block 49 and FIG. 4 is a plan view showing an example of the plane pattern of the NAND cell block 49. In FIG. 4, a configuration including a parallel connection of three cell blocks each of which has the same configuration as the cell block 49 shown in FIG. 3 is shown. In FIG. 4, only the structure lying below a control gate electrode 27 is shown for easy understanding of the cell structure.

As shown in FIG. 3, nonvolatile memory cells M0 to M15 each configured by a MOS transistor having a charge storage layer 26 are serially connected. One end of the series-connected memory cells is connected to a data transfer line indicated by "BL" via a selection transistor S1 and the other end thereof is connected to a common source line indicated by "SL" via a selection transistor S2. The memory cells M0 to M15 and selection transistors S1, S2 are formed on the same p-type well 23. The control electrodes of the memory cells M0 to M15 are respectively connected to data selection lines indicated by "WL0 to WL15". One memory cell block 49 is selected from a plurality of memory cell blocks 49 arranged along the data transfer line BL and the selected memory cell block is connected to the data transfer line BL. For this purpose, the control electrode of the selection transistor S1 is connected to a block selection line SSL and the control electrode of the selection transistor S2 is connected to a block selection line GSL. Therefore, a so-called NAND memory cell block 49 (an area indicated by broken lines) is configured. In the first embodiment, the control lines (block selection lines) SSL, GSL of the selection transistors S1, S2 are formed of a conductor which is the same conductive layer as the charge storage layers 26 of the memory cells M0 to M15. In this case, the control lines are formed to respectively connect the gates of selection transistors S1, S2 which are adjacent in the vertical direction in the drawing sheet of FIG. 3. It is preferable to form the block selection lines SSL, GSL in the same direction as the data selection lines WL0 to WL15 although this is not limitative. This is because the high integration density can be attained by use of the above configuration. The block selection lines SSL, GSL may be provided at least any one for the memory cell block 49. In FIG. 3, an example in which $16=2^4$ memory cells are connected in the memory cell block 49 is shown. However, it is sufficient if the number of memory cells connected to the data transfer line and data selection lines is larger than one. For example, the number of memory cells is preferably set to $2^n$ (n is a positive integer) although this is not limitative. This is because the address decoding process can be easily performed.

Figure 5:
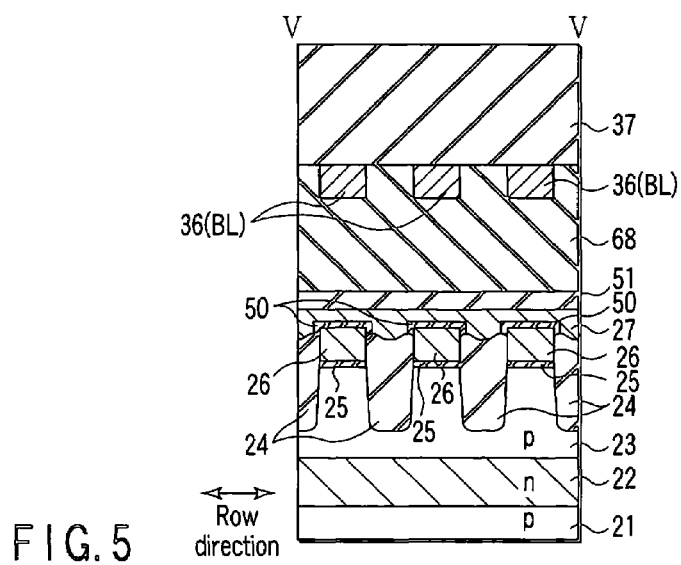
FIG. 5 is a cross sectional view taken along the V-V line of FIG. 4.
Figure 6:
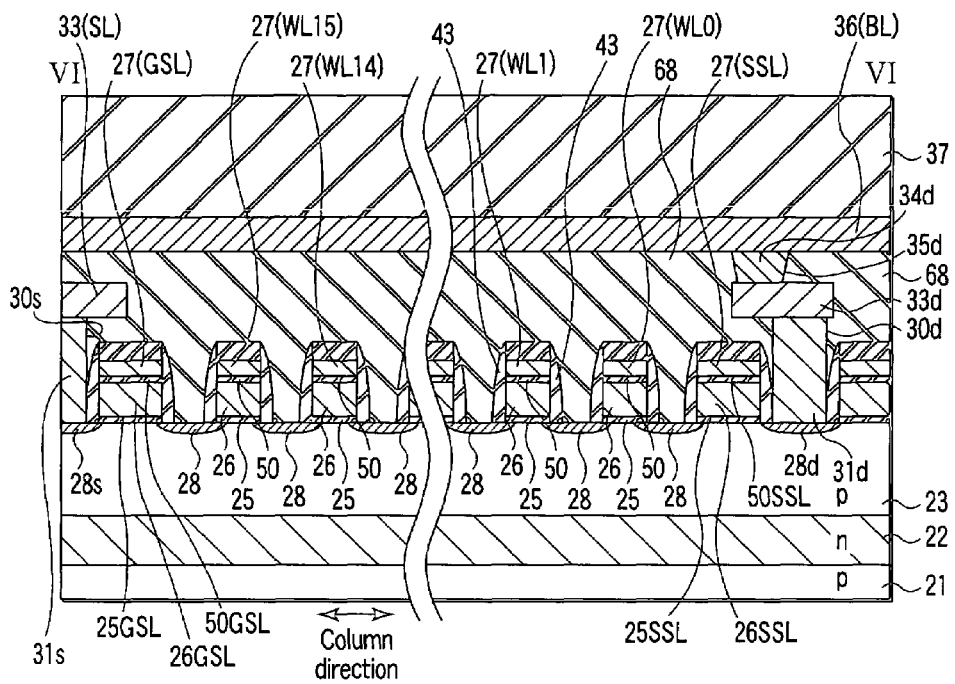
FIG. 6 is a cross sectional view taken along the VI-VI line of FIG. 4.

FIG. 5 is a cross sectional view taken along the V-V line of FIG. 4 and FIG. 6 is a cross sectional view taken along the VI-VI line of FIG. 4. The cross section of FIG. 5 corresponds to the cross section showing an example of the configuration of the memory cell and the cross section of FIG. 6 corresponds to the cross section of an example of the configuration of the memory cell block.

As shown in FIGS. 5, 6, a p-type silicon region 23 contains boron with an impurity concentration of approximately $10^{14}$ $cm^{-3}$ to $10^{19}$ $cm^{-3}$, for example. Tunnel insulating films 25, $25_{SSL}$, $25_{GSL}$ are formed on the p-type silicon region 23. One example of the tunnel insulating film 25 is silicon oxide film having a thickness of approximately 3 nm to 15 nm or a silicon oxynitride film, for example. Charge storage layers 26, $26_{SSL}$, $26_{GSL}$ are formed on the tunnel insulating films 25, $25_{SSL}$, $25_{GSL}$. One example of the charge storage layers 26, $26_{SSL}$, $26_{GSL}$ is a polysilicon layer containing phosphorus or arsenic of approximately $10^{18}$ $cm^{-3}$ to $10^{21}$ $cm^{-3}$ and having a thickness of approximately 10 nm to 500 nm, for example. The tunnel insulating films 25 (25, $25_{SSL}$, $25_{GSL}$) and charge storage layers 26 (26, $26_{SSL}$, $26_{GSL}$) are formed in a self-alignment fashion with respect to the p-type silicon region 23 on a region on which an element isolation insulating film 24 formed of a silicon oxide film is not formed, for example. The above structure is attained by, for example, depositing a tunnel insulating film 25 and charge storage layer 26, patterning the deposited tunnel insulating film 25 and charge storage layer 26, and further continuously etching the p-type silicon region 23 to form shallow trenches with a depth of approximately 0.05 um to 0.5 um in the p-type silicon region 23. Then, an insulating material (element isolation insulating film 24) is formed to fill the shallow trenches to provide the above structure. For example, the advantage of the structure is that the tunnel insulating films 25 and charge storage layers 26 can be formed on a flat plane having no step difference, that is, on the p-type silicon region 23 having no shallow trenches formed therein. Further, a film having uniform thickness and uniform characteristic with respect to the tunnel insulating film 25 and charge storage layer 26 can be attained.

Block insulating films (inter-gate insulating films) 50, $50_{SSL}$, $50_{GSL}$ are formed on the charge storage layers 26, $26_{SSL}$, $26_{GSL}$. One example of the block insulating films 50, $50_{SSL}$, $50_{GSL}$ is an oxynitride film or silicon oxide film with a thickness of approximately 5 nm to 30 nm or a three-layered film of silicon oxide film/silicon nitride film/silicon oxide film, for example. Control gates 27 are formed on the block insulating films 50, $50_{SSL}$, $50_{GSL}$. One example of the control gate 27 is a stack structure of a metal silicide film and polysilicon film or a polysilicon film having a thickness of approximately 10 nm to 500 nm and containing phosphorus, arsenic or boron of approximately $10^{17}$ $cm^{-3}$ to $10^{21}$ $cm^{-3}$. One example of metal silicide is WSi (tungsten silicide), NiSi (nickel silicide), MoSi (molybdenum silicide), TiSi (titanium silicide) or CoSi (cobalt silicide), for example. As shown in FIG. 4, the control gates 27 configure the data selection lines WL0 to WL15, for example. Each of the data selection lines WL0 to WL15 connects the adjacent memory cell blocks 49 and is formed from one end of a memory cell array 1 to the other end thereof in a row direction. For example, the p-type silicon region 23 is isolated from a p-type silicon substrate 21 by use of an n-type silicon region 22. Therefore, the p-type silicon region 23 can be applied with voltage independently from the p-type silicon substrate 21. If the p-type silicon region 23 is formed so as to be applied with voltage independently from the p-type silicon substrate 21, the load of a booster circuit at the erase time can be reduced and the power consumption can be suppressed.

Further, in the memory cell shown in FIG. 5, the side walls (the side walls of the shallow trench) of the p-type silicon region 23 are not exposed to the outside in the etching process when the charge storage layer 26 is divided into portions for the respective memory cells. This is because the side walls of the charge storage layers 26 and the side walls of the p-type silicon region 23 are covered with the element isolation insulating film 24. With the above gate structure, the charge storage layer 26 can be suppressed from being formed into a portion lower than the p-type silicon region 23. Therefore, for example, it becomes possible to attain the advantage that concentration of the gate electric field is suppressed in a boundary portion between the p-type silicon region 23 and the element isolation insulating film 24. Further, the advantage that formation of parasitic transistors having low threshold voltage can be suppressed is attained. For example, concentration of the gate electric field can be suppressed in a boundary portion between the p-type silicon region 23 and the element isolation insulating film 24. Further, a phenomenon in which the program threshold voltage is lowered due to concentration of the gate electric field or a so-called sidewalk phenomenon does not occur. Due to the above advantages, the memory cell shown in FIG. 5 has high reliability.

As shown in FIG. 6, side wall insulating films 43 are formed on both side walls of each of the stacked gate structures having the tunnel insulating films 25 (25, $25_{SSL}$, $25_{GSL}$), charge storage layers 26 (26, $26_{SSL}$, $26_{GSL}$), block insulating films 50 (50, $50_{SSL}$, $50_{GSL}$) and control gates 27. One example of the side wall insulating film 43 is a silicon oxide film or silicon nitride film having a thickness of 5 nm to 200 nm, for example. An n-type diffusion layer 28 is formed in each portion of the p-type silicon region 23 which lies under a portion between the stacked gate structures. The n-type diffusion layer 28 is a source electrode or drain electrode of the memory cell or selection transistor. The memory cell is configured by the n-type diffusion layer 28, tunnel insulating film 25, charge storage layer 26, block insulating film 50 and control gate 27. This is a cell which is a so-called floating-gate type EEPROM cell and the gate length thereof is set in a range of 0.5 μm to 0.01 μm, for example. The n-type diffusion layer 28 contains phosphorus, arsenic or antimony whose surface concentration is set in a range of $10^{17}$ cm$^{-3}$ to $10^{21}$ cm$^{-3}$ and has a depth of approximately 10 nm to 500 nm, for example. Further, the n-type diffusion layer 28 is commonly used by the adjacent memory cells and a so-called NAND connection is realized.

"$26_{SSL}$", "$26_{GSL}$" shown in FIG. 6 indicate gate electrodes respectively connected to the block selection line corresponding to "SSL" and the block selection line corresponding to "GSL". The gate electrodes are formed of the same conductive layer as the floating gate (charge storage layer 26) of the floating-gate type EEPROM. In this specification, "$26_{SSL}$", "$26_{GSL}$" are conveniently used to indicate the charge storage layers, but in practice, "$26_{SSL}$", "$26_{GSL}$" indicate the gate electrodes instead of the charge storage layers. Therefore, the expression of "gate electrodes $26_{SSL}$, $26_{GSL}$" is used below. The gate lengths of the gate electrodes $26_{SSL}$, $26_{GSL}$, that is, the gate lengths of the selection transistors are larger than the gate lengths of the memory cells. For example, the gate length is set in a range of 1 μm to 0.02 μm. If the gate length of the selection transistor is made larger than the gate length of the memory cell, it can be ensured that the ON/OFF ratio at the block selection time and at the block non-selection time can be set high. If the ON/OFF ratio can be set high, it is advantageous to prevent occurrence of erroneous programming and occurrence of erroneous reading.

An n-type diffusion layer $28_d$ formed on the opposite side of the n-type diffusion layer 28 with the gate electrode $26_{SSL}$ disposed therebetween is connected to a data transfer line 36(BL) via a contact $31_d$, intermediate wiring $33_d$ and contact $34_d$. Like the n-type diffusion layer 28, the n-type diffusion layer $28_d$ is a source electrode or drain electrode. An example of a material of the data transfer line 36(BL) is tungsten, tungsten silicide, titanium, titanium nitride or aluminum. A material of the intermediate wiring 33d may also be the same as that of the data transfer line 36(BL), for example. The data transfer line 36(BL) is formed to extend to the boundary of the memory cell array in a horizontal direction on the drawing sheet of FIG. 4 so as to connect the memory cell blocks which are adjacent in the column direction. An n-type diffusion layer $28_s$ formed on the opposite side of the n-type diffusion layer 28 with the gate electrode $26_{GSL}$ disposed therebetween is connected to a source line 33(SL) via a contact $31_s$. Like the n-type diffusion layer 28, the n-type diffusion layer $28_s$ is a source electrode or drain electrode. For example, a source line 33(SL) is formed of the same conductive layer as the intermediate wiring $33_d$. The source line 33(SL) is formed to extend to the boundary of the memory cell array in a vertical direction on the drawing sheet of FIG. 4 so as to connect the memory cell blocks which are adjacent in the row direction. In this example, a case wherein the source line 33(SL) is used is shown. However, the n-type diffusion layer $28_s$ may be formed to extend to the boundary of the memory cell array in a vertical direction on the drawing sheet of FIG. 4 and used as a source line. Further, the contacts $31_d$, $31_s$ are conductive regions and are formed of conductive materials filled in openings $30_d$, $30_s$ formed in an inter-level insulating film 68, for example. An example of a material of the conductor is n-type or p-type doped polysilicon, tungsten, tungsten silicide, aluminum, titanium nitride or titanium, for example. The contact $34_d$ is formed of the same material as the contacts $31_d$, $31_s$. The inter-level insulating film 68 is an insulating film which isolates the source lines 33(SL), data transfer lines 36(BL), selection transistors and memory cells from one another. An example of the material of the inter-level insulating film 68 is silicon dioxide or silicon nitride, for example. An insulting film protection layer 37 and upper wirings (not shown) lying on or above the data transfer lines 36(BL) are formed on or above the upper layer of the inter-level insulating film 68 and data transfer lines 36(BL). An example of a material of the upper wiring is tungsten, aluminum or copper, for example. An example of a material of the insulating film protection layer 37 is silicon dioxide, silicon nitride or polyimide, for example.

As shown in FIGS. 1, 2, the memory cell blocks 49 are arranged in the memory cell array 1. The memory cell block 49 includes series-connected nonvolatile memory cells. Alternatively, it includes nonvolatile memory cells connected in parallel as will be described later.

Sense amplifier circuits 46a, . . . , 46k sense and amplify readout data read out and supplied to data transfer lines BL1a, BL2a, . . . , BL1k, BL2k at the data readout time. The sense amplifier circuits 46a, . . . , 46k are also used as data registers which hold program data at the data program time. Therefore, for example, each of the sense amplifier circuits 46a, ..., 46k is configured by a circuit which mainly contains a flip-flop circuit.

The sense amplifier circuit 46a is connected to the data transfer lines BL1a, BL2a via data transfer line selection transistors Q1a, Q2a. Likewise, the other sense amplifiers are connected and, for example, the sense amplifier circuit 46k is connected to the data transfer lines BL1k, BL2k via data transfer line selection transistors Q1k, Q2k.

The sense amplifier circuits 46a to 46k are connected to a data input/output buffer 45. The electrically connection between the sense amplifier circuits 46a to 46k and the data input/output buffer 45 is controlled by an output of a column decoder 48.

The column decoder 48 receives an address signal from an address buffer 47 and outputs the decode result obtained by decoding the address signal. As a result, program data supplied to the data input/output buffer 45 can be programmed into the memory cell array 1. Further, readout data read out from the memory cell array 1 can be supplied to the data input/output buffer 45 via a third internal I/O line shown in FIG. 1.

A row decoder 3 selects a memory cell in the memory cell array 1. Specifically, the row decoder 3 controls the data selection lines WL0 to WL15 and block selection gates SSL, GSL to select a memory cell in the memory cell array 1. The row decoder 3 is divided into a row decoder 3s for a spare area and a row decoder 3n for a non-spare area. It is preferable to configure a block address specified by the row decoder 3s for the spare area so as to decrease the number of "0" bits to be erased although this is not limitative (for example, refer to FIG. 12). The reason is described later.

The memory cell array 1 of the present embodiment includes a non-spare area 1n and spare area 1s. Each of the non-spare area 1n and spare area 1s includes a plurality of memory cell blocks 49. In the non-spare area 1n, the plurality of memory cell blocks 49 are arranged in a matrix form. Likewise, in the spare area 1s, the plurality of memory cell blocks 49 are arranged in a matrix form (in this case, only the row among the matrix form is shown in FIG. 2). In the non-spare area 1n and spare area 1s, the memory cell blocks 49 arranged in the row direction are commonly connected to the data selection lines WL to configure a so-called page.

When it is required to replace one of the memory cell blocks 49 in the non-spare area 1n, the spare area 1s copies data of the memory cell block 49 in the non-spare area which is required to be replaced and uses one of the memory cell blocks in the spare area 1s. The spare area 1s is configured so that the total number of memory cell blocks 49 in the spare area is will be less than the total number of memory cell blocks 49 in the non-spare area 1n. In this case, in a memory in which data of a block containing a plurality of pages is flash-erased (entirely erased) and the programming process is performed only when program data is present, data of the spare area 1s is previously set in an erased state and the spare area 1s is used when the replacement becomes necessary. By thus previously setting data of the spare area is in the erased state, time required for erasing data of the spare area 1s when the replacement becomes necessary can be reduced.

A reference potential control circuit 42 controls potential of the p-type silicon region 23 (or p-type silicon substrate 21) in which the memory cell array 1 is formed. It is preferable that the reference potential control circuit 42 can generate an erase voltage of 10V or more, for example, at the erase time although this is not limitative.

For example, a Vpgm generation circuit 41a generates program voltage Vpgm obtained by boosting the power supply voltage. The program voltage Vpgm is used for a selected memory cell at the data program time. For example, the program voltage Vpgm is supplied to the control gate (data selection line WL) of the selected memory cell. One example of the program voltage Vpgm is a range of 6V to 30V.

A Vpass generation circuit 41b generates programming intermediate voltage Vpass. The programming intermediate voltage Vpass is used for a non-selected memory cell at the data program time. For example, the programming intermediate voltage Vpass is supplied to the control gate (data selection line WL) of the non-selected memory cell at the data program time. One example of the programming intermediate voltage Vpass is a range of 3V to 15V.

A Vread generation circuit 41c generates readout intermediate voltage Vread. The readout intermediate voltage Vread is used for a non-selected memory cell at the data readout time. For example, the readout intermediate voltage Vread is supplied to the control gate (data selection line WL) of the non-selected memory cell at the data readout time. One example of the readout intermediate voltage Vread is a range of 1V to 9V. In a case where the memory cell array 1 is a NAND memory cell array, the readout intermediate voltage Vread may be set to voltage which is higher than the upper limit of the program threshold voltage of the memory cell by approximately 1V, for example, although this is not limitative. The readout intermediate voltage Vread may be thus set in order to acquire a sufficiently large read current and suppress read-disturb.

A Vref generation circuit 41d generates threshold value determining voltage Vref. The threshold value determining voltage Vref is used for a selected memory cell at the data readout time. For example, the threshold value determining voltage Vref is supplied to the control gate (data selection line WL) of the selected memory cell at the data readout time. One example of the threshold value determining voltage Vref is an intermediate voltage between threshold voltage distributions of the memory cell which are logically separated and logically adjacent to each other. For example, in the case of a binary memory, the threshold value determining voltage Vref is set to a voltage between the threshold voltage distribution corresponding to data "1" and the threshold voltage distribution corresponding to data "0". Further, if a multivalue memory is used and multivalue data is determined according to the threshold value determining voltage Vref, a plurality of voltages are set as the threshold value determining voltage Vref. For example, in the case of a four-value memory, three threshold value determining voltages Vref1 to Vref3 are set as follows.

The threshold value determining voltage Vref1 is set to voltage between the threshold voltage distribution corresponding to data "11" and the threshold voltage distribution corresponding to data "10".

The threshold value determining voltage Vref2 is set to voltage between the threshold voltage distribution corresponding to data "10" and the threshold voltage distribution corresponding to data "00".

The threshold value determining voltage Vref3 is set to voltage between the threshold voltage distribution corresponding to data "00" and the threshold voltage distribution corresponding to data "01".

The voltage generation circuits 41a, 41b, 41c, 41d, 42 which generate the above voltages are controlled by a control circuit 40. Thus, the voltage generation circuits 41a, 41b, 41c, 41d, 42 respectively supply necessary voltage outputs to a data selection line driver 2 or p-type silicon region 23 (or the p-type silicon substrate 21) in the states of "data program", "data readout" and "data erase".

The data selection line driver 2 is a switching circuit which selectively supplies voltage outputs of the voltage generation circuits 41a, 41b, 41c, 41d, 42 to the control gate (data selection lines WL0 to WL15) of the memory cell which is required to be subjected to the program or readout operation and the control gate (block selection lines SSL, GSL) of the selection transistor selected.

In all of the embodiments in this specification, if the number "n" of data bits read out by a series of sequential operations is set larger than $\{2^{m-1}-t\times(m-1)-1\}$ and set equal to or smaller than $(2^m-t\times m-1)$ and "t" is a natural number larger than "1", memory cell blocks 49 of at least (n+t×m) are arranged in parallel in a horizontal direction on the drawing sheet of FIG. 2, that is, in a direction (row direction) in which the data selection lines WL extend. This corresponds to one page.

In the example shown in FIG. 2, like the number of parallel connections of one page of the memory cell blocks 49, it is preferable to prepare sense amplifier circuits 46 of at least (n+t×m). By thus preparing the sense amplifier circuits 46 and memory cells, for example, a bit error of bits which are set in a range of two bits to "t" bits of one page read out by a series of sequential operations of the memory cell array 1 is detected and the position of the bit error can be detected by use of the BCH (Bose-Chaudhuri-Hocquenghem) coding. For example, if a plurality of memory cells belonging to one page are commonly connected to one data selection line WL, the plurality of memory cells can be simultaneously selected by one data selection operation.

Further, the input/output port of the sense amplifier circuit 46 is connected to the control circuit 40 which controls the read, program and erase operations of the memory cell. For example, the control circuit 40 controls the read, program and erase operations of the memory cell by using data supplied to the data buffer as a command input.

Although not shown in FIG. 1 for clarification, a control signal which controls the operation of the sense amplifier circuit 46 and control signals (sel1, sel2 in FIG. 2) which select an odd-numbered data transfer line (BL1) or even-numbered data transfer line (BL2) are input from the control circuit 40 to the sense amplifier circuit 46. In FIG. 1, a portion surrounded by broken lines 7 typically shows a memory device formed on one semiconductor substrate as a NAND flash memory, for example. As the broken-line portion 7, a circuit block described in Jpn. Pat. Appln. KOKAI Publication No. 2002-150783 may be used. Therefore, the detailed explanation thereof is omitted.

Next, the ECC circuit 100 is explained. In the following explanation, a data string before coding is called information bits, a bit added at the coding time is called a check bit, a bit string which is a data string after decoding and indicates the error position following the information bits is called a syndrome, and a code which is obtained by reading out data from the memory device and may contain an error is called a reception code.

The data input/output buffer 45 is connected to the ECC circuit 100 via an internal I/O line. The ECC circuit 100 includes an error bit detection circuit 5 and error bit number determination circuit 6. The error bit detection circuit 5 can be designed to output an error detection signal containing error information to the error bit number determination circuit 6. Further, the error detection signal can be replaced by a syndrome output from the error bit detection circuit 5 via a first I/O line. The error bit number determination circuit 6 transfers data between the data memory system according to this embodiment and the exterior via an external input/output terminal (external I/O). The error bit number determination circuit 6 determines whether or not the number of error bits is equal to or larger than the preset reference value which is larger than "1". The reference value can be set equal to the number of bits which can be relieved by the ECC circuit. If the reference value is set equal to the number of bits which can be relieved by the ECC circuit, it is possible to attain the advantage that the number of blocks which are used for replacement without generating error bits after relieving the error bits by use of the ECC circuit can be reduced and the number of spare blocks required can be reduced. Further, when the number of error bits becomes equal to or larger than the preset reference value which is larger than "1", it is possible to perform the operation for outputting a signal which informs the exterior about occurrence of the above state via an external I/O, copying data of a block in which the error bits occur by use of an external circuit connected to the external I/O and replacing the above block by a spare block.

Figure 7:
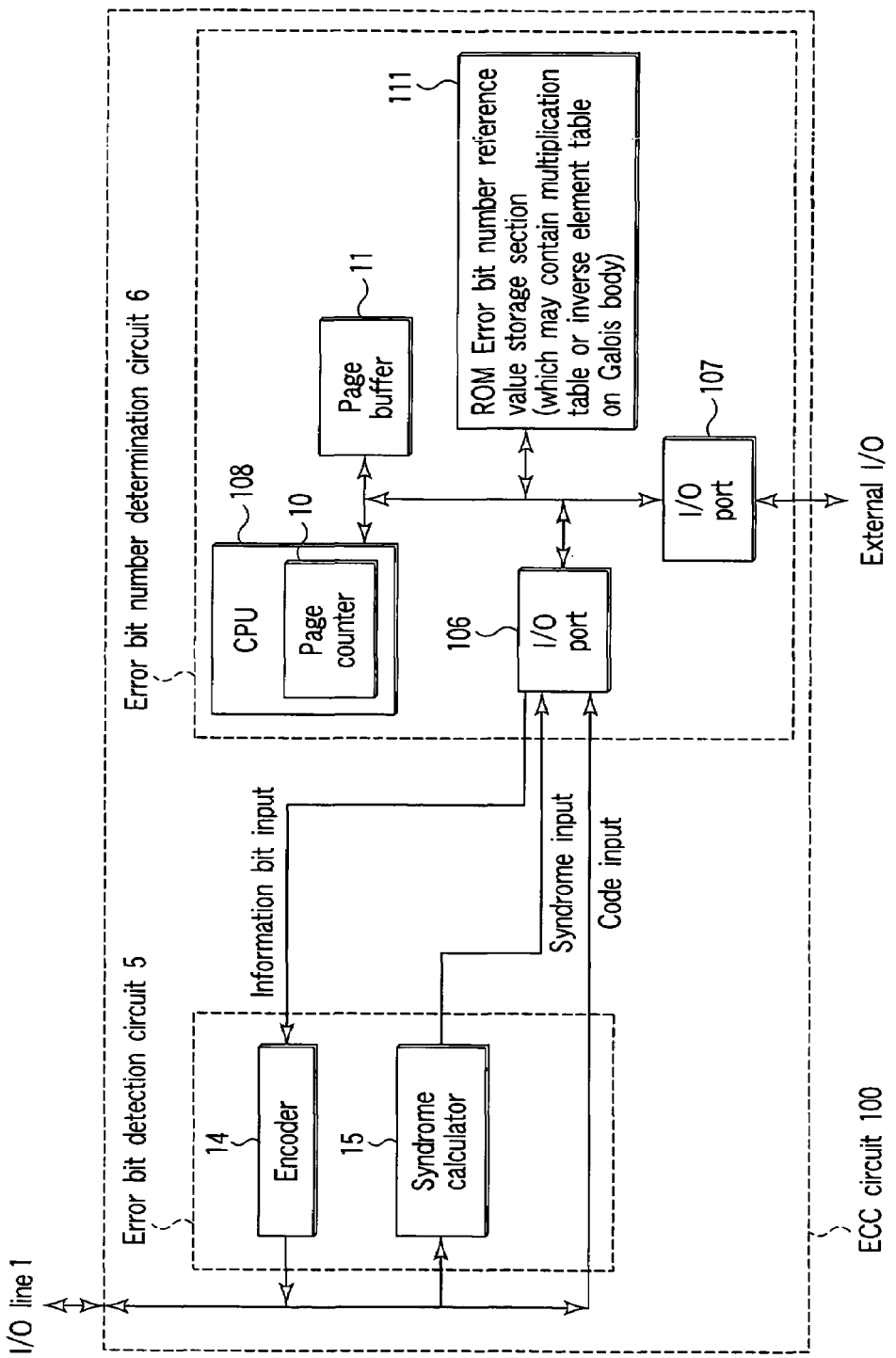
FIG. 7 is a block diagram showing an example of the configuration of an ECC circuit 100 shown in FIG. 1.

FIG. 7 is a block diagram showing an example of the configuration of the ECC circuit 100.

As shown in FIG. 7, the error bit number determination circuit 6 includes a CPU 108, page buffer 11, a ROM 111 which stores the reference value of the error bit number and I/O ports 106, 107. For example, the ECC circuit 100 may include a page counter 10 configured by a flip-flop or nonvolatile memory. For example, the page counter 10 is provided in the CPU 108. The page counter 10 stores an index of the page number in the block to which the block contents are transferred. As the page counter 10, a counter having stages of a number corresponding to the bit number which is equal to or larger than $\log_2(i)$ with the page number set as "i" may be prepared. Further, the page counter 10 has a reset function of setting at least the whole bits of the counter to a constant initial value and a function of increasing the page number so as to access all of the pages in one block one at a time. In the following explanation, as the functionally simplest example of the page counter 10, the page counter which has a reset function of setting an index of the first page to an initial value and a function of increasing the page number by "1" is explained.

Further, the error bit number determination circuit 6 may include a page buffer 11 configured by a nonvolatile memory such as an SRAM or DRAM. If the page buffer 11 is thus provided, a data correction process and a process for programming corrected data into the spare area can be performed in the data memory system shown in FIG. 1. In this case, since an operation and time for outputting data to the external I/O line and transferring data with respect to the external device (for example, external memory) are not necessary, the advantage that the operation is performed at high speed can be attained. Of course, the page buffer 11 is provided outside the data memory system of FIG. 1 and if it is set in a programmable/readable state by use of the external I/O, the operation of replacement into the spare block shown in this example can be realized. As the number of bits required in the page buffer 11, the number of bits equal to or larger than the number of code bits can be used.

The error bit detection circuit 5 is a circuit which outputs a syndrome. The syndrome contains a data error of a series of data items output from the data input/output buffer 45. If error correction of two or more bits is required as shown in this example, it is necessary to perform multiplication and division on the Galois body in order to derive the faulty bit position based on the syndrome. In this example, assume that the error bit number determination circuit 6 is used to specify the faulty bit position and output the positional information to an error detection signal line or first internal I/O line. In the error bit detection circuit 5, in this example, a code which can be used for error correction of two or more bits is used. For this purpose, as the error bit detection circuit 5, for example, a cyclic code decoder may be used. The reason why a code which can be used for error correction of two or more bits is used will be explained later. The code which can be used for error correction of two or more bits is advantageous in order to attain the effect while suppressing an increase in the area of spare pages to be used instead of pages containing faulty bits to a sufficiently low rate, for example, to the rate of 5% or less of the number of spare pages to the number of non-spare pages. Further, when a code for correcting a one-bit error is used, the number of error bits which can be corrected is one bit even if the error bits which can be corrected are present. Of course, it is not contained in the constituents of the error bit number determination circuit 6 which has the reference value larger than one as in this example.

Figure 8:
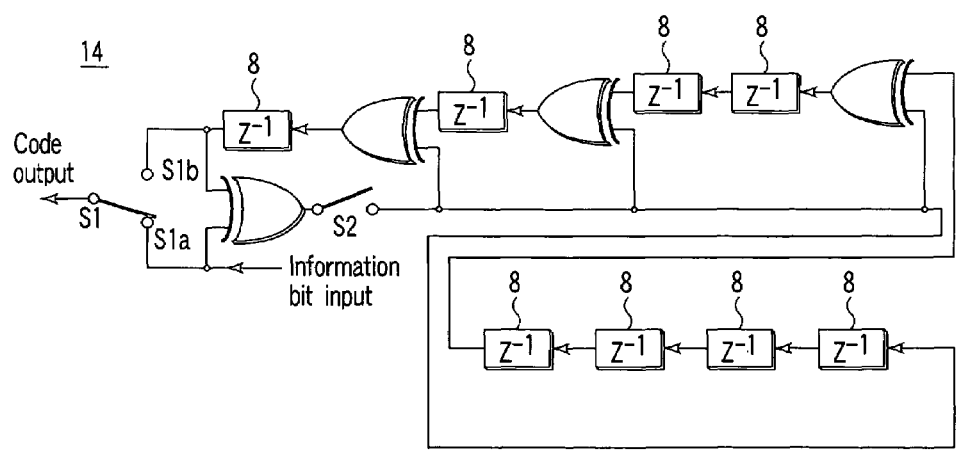
FIG. 8 is a circuit diagram showing an example of the circuit of an encoder 14 shown in FIG. 7.

FIG. 8 is a circuit diagram showing an example of the circuit of an encoder 14 provided in the error bit detection circuit 5, and FIGS. 9 and 10 are circuit diagrams showing examples of the circuit of a decoder (syndrome calculator) 15 provided in the error bit detection circuit 5. The encoder 14 shown in FIG. 8 is a concrete example of a data cyclic BCH code encoder. FIGS. 9 and 10 show concrete examples of a data cyclic BCH code decoder. The data cyclic BCH code encoder/decoder configures a 15-bit code by use of which an error of two bits can be corrected for 7-bit data, for example. In the following explanation, a case wherein the contents of a page in which an error occurs are copied in a spare block and thus the block is replaced when a two-bit error occurs is considered. Further, in the following explanation, the cyclic BCH code using the elements on the Galois body $GF(2^4)$ is shown in order to clarify the explanation. In this case, however, it is clearly understood that the circuit which deals with a Reed-Solomon code and cyclic BCH code on a given Galois body can be configured and used. Further, according to custom, the logical value of the erase state is "1" and the logical value of the program state is "0". However, in this example, the logical values are inversely defined so that the logical value of the erase state will be "0" and the logical value of the program state will be "1". The above definition is made so that the state in which all of the logical values of the syndrome are "0" will correspond to a "no error" state since usage of the circuit which makes linear error correction is explained in this embodiment. Thus, an initial value free from an error can be attained even if a new code is not programmed into the syndrome in a case where the erase process for the entire portion of one block containing the syndrome is performed. Of course, it is possible to set the program and erase logical values of the memory cell according to custom and inversely set the logical values with respect to the logical values of the memory cell in the error bit detection circuit 5 by inserting a logical inverter circuit into the first internal I/O line.

As shown in FIG. 8, assume that information bits of seven bits are time-sequentially input for each unit time. Further, a circuit indicated by a reference symbol 8 is a circuit which delays an output by one unit time and can be configured by a latch circuit or a flip-flop such as a D-type flip-flop which is known, for example. In the case of the D-type flip-flop, assume that the logical value is set to "0" before a clock is applied. The clocks can be synchronously applied to all of a plurality of circuits 8. This is to simplify the clock wiring. A reference symbol S1 (S1*a*, S1*b*) indicates a switching circuit. The switching circuit S1 is connected to the "S1a" side while information bits are being input, that is, data of the first bit to the seventh bit is being input and is connected to the "S1b" side while the check bit is being output after the end of inputting of the information bits, that is, data of the eighth bit to the fifteenth bit is being input. A reference symbol S2 also indicates a switching circuit. The switching circuit S2 is set in a connected state while information bits are being input, that is, data of the first bit to the eighth bit is being input and outputs the logical value "0" in a direction to a mark o (white dot) in FIG. 8 while the check bit is being output after the end of inputting of the information bits, that is, data of the eighth bit to the fifteenth bit is being input. The above operation is performed by applying 15 clocks until outputting of the 15 bits is terminated so as to form a cyclic BCH code which can be used for two-bit correction.

FIG. 13 shows elements $\alpha^i$ of the Galois body $(2^4)$ in this example. As is well known in the art, addition on the Galois body is performed by calculating the exclusive-OR of factors indicated by vector representations shown in FIG. 13. For example, the following equation can be attained.

$$\alpha^0 + \alpha^4 = (0001) + (0011) = (0010) = \alpha^1$$

Since "$2^4 - 1 = 15$", multiplication and division are calculated as follows.

$$\alpha^i \times \alpha^j = \alpha^{(i+j) mod 15}$$

$$\alpha^i / \alpha^j = \alpha^{(i-j) mod 15}$$

The inverse element $\alpha^{-i}$ of the element $\alpha^i$ can be derived by the following equation.

$$\alpha^{-i} = \alpha^0 / \alpha^i$$

A primitive formation polynomial $G_s(x)$ of the double error correction binary BCH code having 15-bit code length can be given as follows by using $M_i(x)$ as the minimum polynomial of $\alpha^i$.

$$\begin{aligned} G_s(x) &= M_1(x) \times M_3(x) \\ &= (x^4 + x + 1) \times (x^4 + x^3 + x^2 + x + 1) \\ &= x^8 + x^7 + x^6 + x^4 + 1 \end{aligned}$$

The circuit shown in FIG. 8 represents $G_s(x)$ in a circuit form. Therefore, in a coding process, a coding output line is electrically connected to the I/O line 1 and the external I/O is electrically connected to an information bit input line via the data input/output control circuit including the error bit number determination circuit 6. Thus, a code which can be used for 2-bit correction can be programmed into the memory cell.

For example, the external I/O indicates an input/output portion connected to the exterior of a package containing the data memory system of this example or the input/output terminal of a memory card via a connector or radio communication means.

The concrete examples of the data cyclic BCH code decoder shown in FIGS. 9 and 10 are a circuit example of the syndrome calculator 15 which calculates binary four bits, that is, the syndrome on the Galois body $GF(2^4)$ based on the cyclic BCH code.

The syndrome calculator 15 receives an output of syndromes s1, s3 indicating error position information when a period of 15 unit times has elapsed after inputting of a reception code. The syndromes s1, s3 are syndromes corresponding to $M_1(x)$, $M_3(x)$. The detail error correction process is explained later, but it can be determined that no error occurs if the syndromes s1, s3 are all set to "0".

Further, in a case other than the above case and in the case "s1$^3$+s3" is (0000), it can be determined that a one-bit error occurs. If "s1$^3$+s3" is not (0000), it can be determined that a error of two or more bits has occurred.

In this case, "s1³+s3" is calculated on the Galois body by using the primitive polynomial which is expressed as follows.

$$M_1(x)=x^4+x+1$$

Based on the above description, a circuit which detects an error of two or more bits in the memory cells and outputs the positional information thereof by calculating "s1³+s3" by use of the CPU 108 shown in FIG. 7 can be configured. In the decoding process, the configuration shown in FIG. 7 which electrically connects a code input line to the I/O line 1 and electrically connects the code and syndromes s1, s3 to the error bit number determination circuit 6 is formed.

Further, a primitive formation polynomial of the single error correction binary BCH code having 15-bit code length is given as follows $$M_1(x)=x^4+x+1$$

Therefore, as shown in FIG. 9, four binary outputs of a unit-time delay circuit are sequentially fed back to a plurality of circuits 8 via a×α circuit 200 which multiplies a unit element on the Galois body GF($2^4$) by α. Thus, a syndrome s1 having α as the unit element can be obtained. Likewise, as shown in FIG. 10, three×α circuits 200 are serially connected and the outputs thereof are sequentially fed back to a plurality of circuits 8. Thus, a syndrome s3 having $\alpha^3$ as the unit element can be obtained. Likewise, a syndrome sk having $\alpha^k$ as the unit element can be obtained by serially connecting k×α circuits 200 and sequentially feeding the outputs thereof back to a plurality of circuits 8.

Next, one example of the operation of the error bit number determination circuit 6 is explained with reference to the flowchart shown in FIG. 11. In the explanation of the example of the operation, a case of two-bit error correction is shown.

Figure 11:
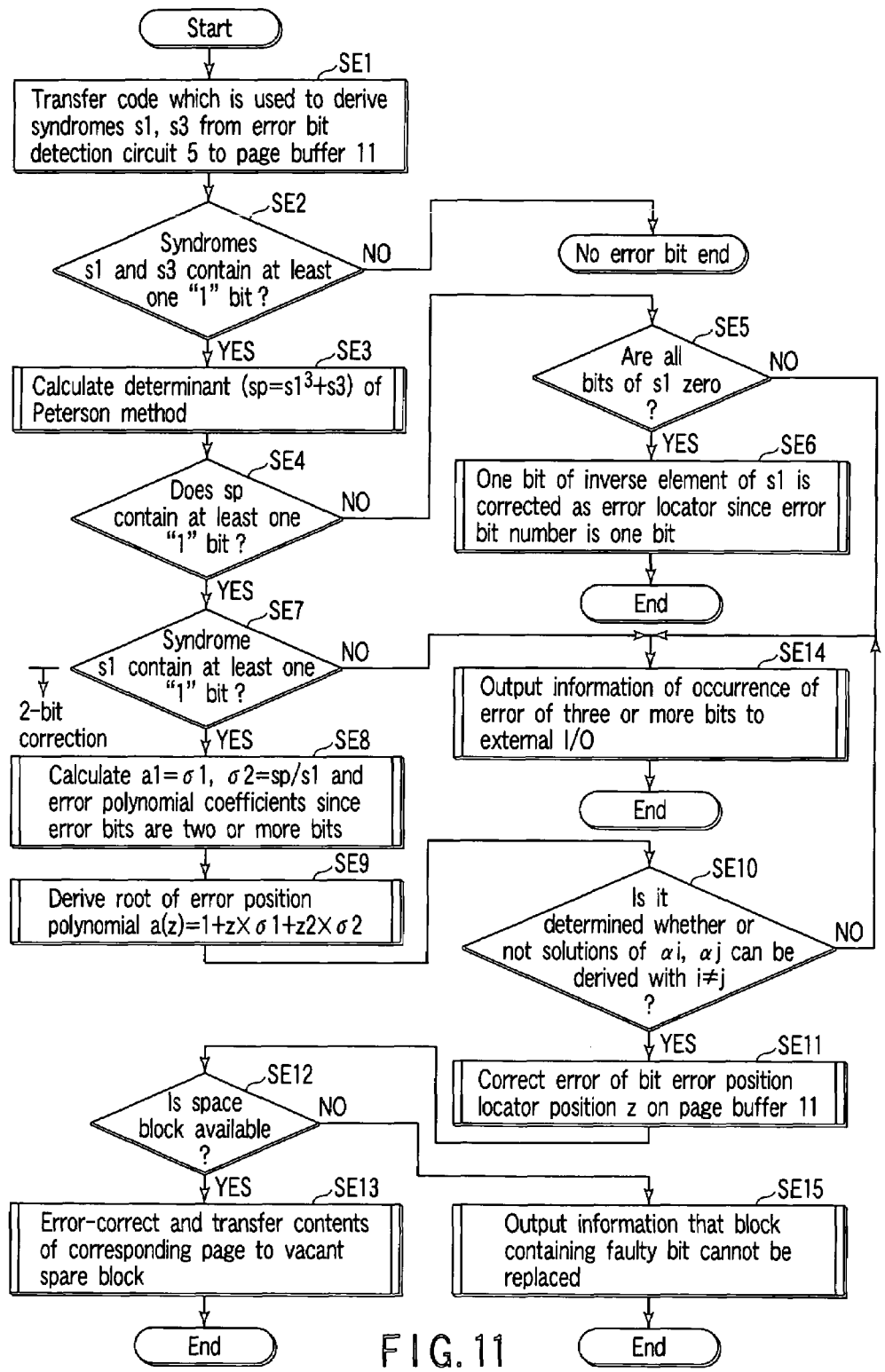
FIG. 11 is a flow diagram showing an example of the replacement operation of the data memory system according to the first embodiment of this invention.

In the example of the operation shown in FIG. 11, a page in which error determination bits of a number larger than "1", in this case, a two-bit error has occurred at the read time is selectively replaced by a vacant spare block after page data is corrected by use of ECC. In this embodiment, a page in which an error of two bits larger in number than one bit occurs is selected and selectively replaced.

First, in SE1, syndromes s1, s3 are transferred from the error bit detection circuit 5 to the error bit number determination circuit 6 via the I/O port 106. Further, a reception code is transferred from the error bit detection circuit 5 to the page buffer 11 in the error bit number determination circuit 6 via the I/O port 106.

Then, in SE2, it is determined whether or not one of the syndromes s1 and s3 contains at least one "1". If none of the syndromes s1, s3 contain "1", it is determined that "no error is present" (N: No). In this case, first seven bits among the code bits are output as information bits. If one of the syndromes s1 and s3 contains at least one "1", it is determined that "an error is present" (Y: Yes). In this case, the process proceeds to SE3 and the CPU 108 calculates the following determinant of the Peterson method.

$$sp=s1^3+s3$$

At this time, the multiplication table and inverse element table of the Galois body GF($2^4$) are contained into the ROM 11 of the error bit number determination circuit 6, for example (multiplication table ROM and inverse element table ROM). As a result, the multiplication operation can be performed at high speed. Since the syndromes s1, s3 of four bits are used in this example, the multiplication table ROM can be configured to output four bits in response to an input of "four bits+four bits=eight bits" and can be realized by a memory device of $2^8 \times 2^4$=4096 bits, for example. Likewise, the inverse element table ROM can be configured to output four bits in response to an input of four bits and can be realized by a memory device of $2^4 \times 2^4$=256 bits, for example. As will be described later, in a case wherein correction of an error of two or more bits is coped with by forming a correspondence table in which syndromes are used as addresses and corresponding error position locators are output, a correspondence table having bits of a number extremely larger than (4096+256) bits is required. In a method which derives an error position locator by calculation when two or more bits are present, a memory device of the above bits can be used. Thus, in a method using the multiplication table ROM and inverse element table ROM, it is possible to attain the advantage that the number of memory elements can be reduced and the circuit area can be made small even when the number of error correction bits is increased. Of course, the multiplication table ROM and inverse element table ROM are different from so-called ROM mapping and can be configured by a logic circuit using a syndrome as an address input and outputting a corresponding error position locator.

Next, in SE4, it is determined whether or not the determinant sp contains at least one "1". If the determinant sp does not contain at least one "1", the process proceeds to SE5 (N) and it is determined in SE5 whether or not the syndrome s1 contains at least one "1".

If it is determined in SE5 that the syndrome s1 contains at least one "1", an error bit is one bit. In this case, the process proceeds to SE6 (Y). In SE6, the inverse element of the syndrome s1 is calculated by use of the CPU 108. If the inverse element of the syndrome s1 is "$\alpha^k$" by referring to the elements shown in FIG. 13, it can be considered that "a (k+1)th bit counted from the bit which is finally input among the 15 bits is an error". Therefore, in SE6, the (k+1)th bit counted from the bit which is finally input is bit-inverted and corrected. After this, the first seven bits among the corrected code bits are output as information bits.

If it is determined in SE5 that the syndrome s1 does not contain "1" at all, it is determined that a bit error of three or more bits has occurred. In this case, the process proceeds to SE14 (N). In SE14, a signal indicating that the bits cannot be relieved by use of the ECC is output to the external I/O and the process is terminated.

Further, if it is detected in SE4 that the determinant sp has at least one "1" bit, the process proceeds to SE7 (Y) and it is determined in SE7 whether or not the syndrome s1 contains at least one "1" bit.

If it is determined in SE7 that the syndrome s1 does not contain "1" at all, it is determined that a bit error of three or more bits has occurred. In this case, the process proceeds to SE14 (N). In SE14, a signal indicating that the bits cannot be relieved by use of the ECC is output to the external I/O and the process is terminated.

If it is determined in SE7 that the syndrome s1 contains at least one "1" bit, it is detected that a bit fault of two or more bits has occurred. In this case, the process proceeds to SE8 (Y).

In SE8, coefficients σ1, σ2 of an error position polynomial σ(z) are calculated as follows on the Galois body.

$$\sigma 1=s1$$

$$\sigma 2=sp/s1$$

Next, in SE9, the element of the Galois body GF($2^4$) is substituted for "z" of the error position polynomial [σ(z)=1+z×σ1+z²×σ2] and the solution for [σ(z)=0] is derived.

At this time, the multiplication operation can be performed at high speed by containing the multiplication table ROM on the Galois body GF($2^4$) into the error bit number determination circuit 6, for example, ROM 111.

Next, in SE10, "i", "j" are set to integers (i≠j) which are different from each other in a range of {(the number of elements of the Galois body)−1} to 0 and whether or not the solutions of "$\alpha^i$", "$\alpha^j$" can be derived is determined.

If the solutions are not derived, it is determined that a bit error of three or more bits has occurred and the process proceeds to SE14 (N). In SE14, a signal indicating that the bit error cannot be relieved by use of the ECC is output to the external I/O and the process is terminated.

If the solutions are derived, "$\alpha^i$", "$\alpha^j$" are set by referring to the elements shown in FIG. 13 and it can be considered that "a (i+1)th bit and (j+1)th bit counted from the bit which is finally input among the 15 bits are errors". Therefore, in SE11, the (i+1)th bit and (j+1)th bit counted from the bit which is finally input may be bit-inverted and corrected.

Next, in SE12, it is determined whether or not a spare block which is not yet used is available. For this purpose, for example, a block address information memory area which stores addresses of available spare blocks is previously prepared in an FAT (File Allocation Table) area. For example, the addresses of the spare blocks which have been used are stored in the block address information memory area. In SE12, whether or not a spare block which is not yet used is available can be determined by checking the addresses of the spare blocks stored in the block address information memory area. The block replacement method will be described later in detail. In SE12, if it is determined that "a vacant spare block area is present", the process proceeds to SE13 (Y). In SE13, the contents of a corresponding page are error-corrected and transferred to a vacant spare block area. After the above operation, the operation of replacing the block address of the corresponding page described in the FAT area by an address of the vacant spare block may be performed.

If it is determined in SE12 that "no vacant spare block area is present", the process proceeds to SE15 (N). In SE15, a signal indicating that no vacant spare block is present is output from the external I/O. After the above operation, the operation of programming the contents of the corresponding page back to the original memory block address may be performed.

The example of the operation shown in FIG. 11 is a method which derives an error bit position based on calculations by use of the Peterson method. According to this method, since an error position locator is derived by calculation without referring to the correspondence table, a large ROM area 111 required for the correspondence table is not necessary and a circuit of smaller ROM capacity can be used. Therefore, it is advantageous in reducing the area of the ROM circuit and it becomes possible to suppress the power consumption in the ROM circuit.

Further, in the present embodiment, particularly, assignment of block addresses of the non-spare area and the spare area is devised.

FIG. 12 shows an example of assignment of block addresses of the non-spare area and the spare area.

In the assignment example of FIG. 12, a flag address bit used to determine the non-spare area or the spare area is added to a real address of the non-spare area. Further, the flag address bit is set to "0" in the non-spare area and the flag address bit is set to "1" in the spare area. In the assignment example of FIG. 12, for example, "y" in the block address of the non-spare area indicates a bit which will be set to "0" or "1" and the most significant bit is used as a flag address bit which determines the non-spare area or the spare area. That is, the block address of the non-spare area is set to (0yyyyyyyyyy) and the block address of the spare area is set to (1yyyyyyyyyy). Of course, the most significant bit is not necessarily used as the flag address bit used to determine the non-spare area or the spare area, but it is possible to use a bit in a given position, for example, the least significant bit.

Further, in the present embodiment, the block addresses are assigned to reduce the number of bits "0" contained in the block address of the spare area. For this purpose, for example, it is necessary to assign the block addresses so as to make the number of "0" bits smaller than the number of "1" bits. For example, this is attained by containing a block address of (1111111111) in which all of the address bits are "1" in the block addresses of the spare area. Further, one example of the method which more adequately assigns the block addresses is explained below.

In a case wherein all of the address bits other than the flag address bit are "1", (1111111111) is set as a class 0 in the example of FIG. 10. Further, assume that a class i can be obtained by replacing freely selected i bits of "1" in the class 0 by "0". For example, the class 1 is obtained by replacing one bit in the class 0 by "0" and the class 2 is obtained by replacing two bits in the class 0 by "0". Likewise, the classes are determined and the block addresses of the lower classes such as the class 1, class 2, class 3 are selectively assigned to the block addresses of the spare area. As a result, the block addresses of the spare area become non-continuous. Thus, the operation of rewriting the area which stores the block addresses at the time of data transfer into the spare block shown in SE13, for example, the FAT area rewriting operation can be performed at high speed without erasing the FAT area. This is because data of the whole block containing FAT is required to be saved and erased in order to set "1" data to "0" data, but in the flash memory, the operation of setting "0" data into "1" data can be performed at higher speed than the erase operation by performing an additional programming operation for each page.

In a typical method for assigning continuous addresses in the non-spare area, the following problem occurs even if the block addresses are adequately assigned. That is, the class 3 appears after seven block addresses from the class 0 as indicated below.

Class 0 of (1111111111)
Class 1 of (1111111110)
Class 1 of (1111111101)
Class 2 of (1111111100)
Class 1 of (1111111011)
Class 2 of (1111111010)
Class 2 of (1111111001)
Class 3 of (1111111000)

Likewise, the class n appears after ($2^n$−1) from the class 0.

In the address assignment of the present embodiment, the numbers of addresses of the class 0, class 1, class 2 are expressed by [1+k+k×(k−1)/2] where "k" denotes the number of data bits except the flag indicating the spare area.

In the example of FIG. 12 in which k=10, for example, 56 block addresses at maximum which is extremely larger in number than 8−1=6 in the typical example can be held in or below the class 2. The operation of selecting the address of the spare block may be performed according to a sequence shown in FIG. 14, for example, with respect to a desired address of the non-spare area.

Figure 14:
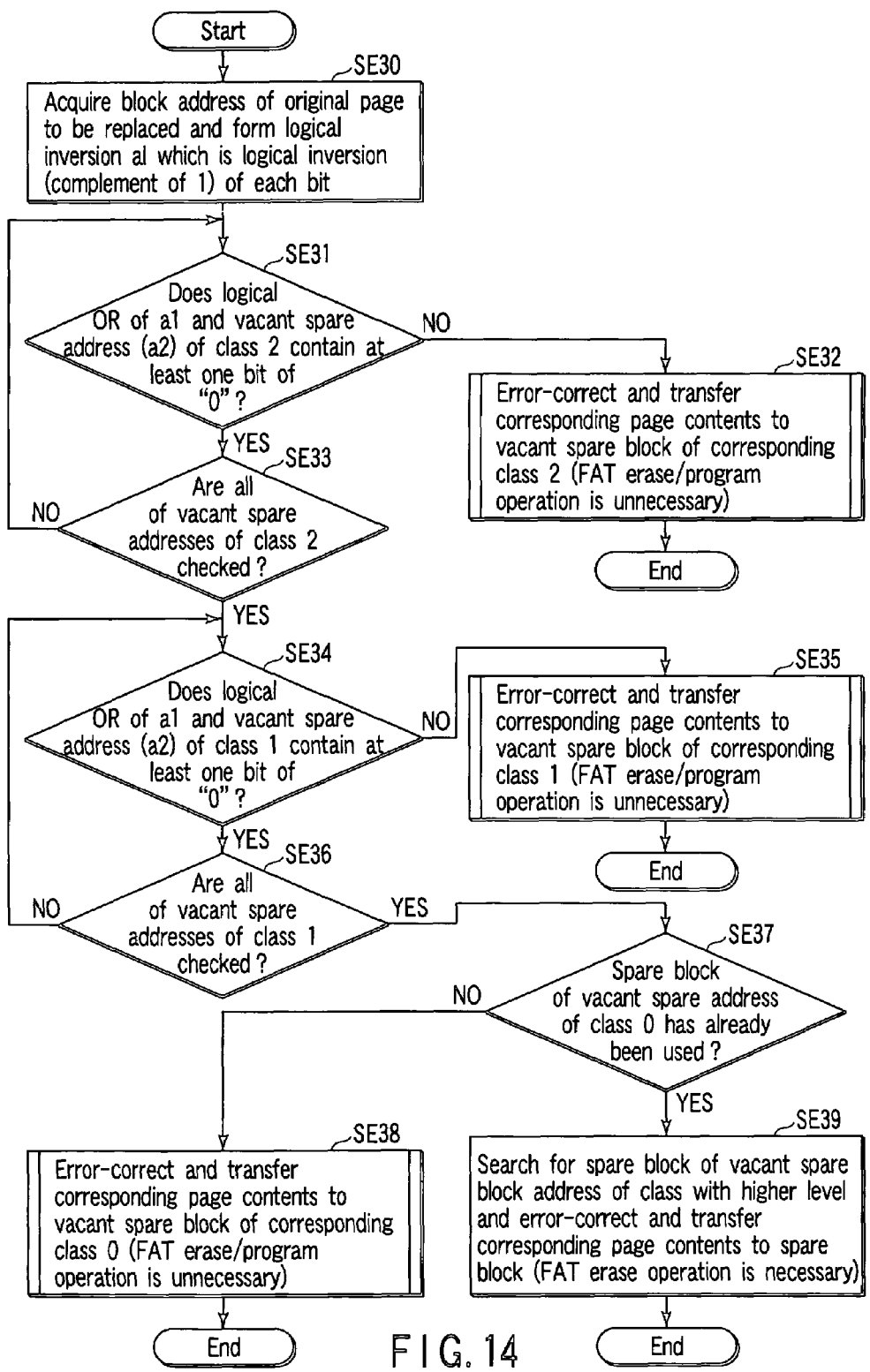
FIG. 14 is a flow diagram showing an example of the block selecting operation of the data memory system according to the first embodiment of this invention.

FIG. 14 shows a replacement example in a case where the spare block of up to the class 2 is prepared. The number of classes can be expanded by forming the same flow as the flow of SE31 to SE33 for each class and setting the flows between SE30 and SE31 as a sequence in order of the higher level of the class. FIG. 14 shows an example of an address selection sequence of the spare block corresponding to SE13 of FIG. 11 or SE25 of FIG. 19 which will be described later.

First, in SE30, a block address containing an original page to be replaced is acquired and logical inversion al of the acquired block address is formed. At this time, it is generally required to invert the block address which does not contain the flag area indicating the spare area. However, it is possible to invert the block address which contains the flag area indicating the spare area in a case where the block address of the non-spare area is set to (0yyyyyyyyyy) and the block address of the spare area is set to (1yyyyyyyyyy) as described before.

Next, in SE31, the logical OR of the logical inversion al and the vacant spare block address (a2) of the class 2 is derived and it is determined whether or not at lest one bit of "0" is contained for each bit. If "0" is contained, the address bit of the spare area is set at "0", that is, the erase state is set. At the same time, the address bit of the original data page area is set at "1", that is, the program state is set. In other cases, the erase state of "0" is changed only to the erase state of "0" or program state of "1" for each bit in response to a change of the addresses of the data page area contained in the FAT area. Therefore, in SE32, the corresponding page is error-corrected and transferred to the spare block of the address obtained in SE31 and the additional program operation may be performed for a change of the address of the data page area contained in the FAT area without performing the erase operation.

After this, in SE33, it is determined whether or not all of the vacant spare addresses which have been used for data replacement of the class 2 are checked. All of the blocks in the class 2 are checked according to a sequence of SE31, SE33.

Next, in SE34, the logical OR of the logical inversion al and the vacant spare block address (a2) of the class 1 is derived and it is determined whether or not at least one bit of "0" is contained for each bit. If "0" is contained, the address bit of the spare area is set at "0", that is, the erase state is set. At the same time, the address bit of the element data page area is set at "1", that is, the program state is set. In other cases, the erase state of "0" is changed only to the erase state of "0" or program state of "1" for each bit in response to a change of the address of the data page area contained in the FAT area. Therefore, in SE35, the corresponding page is error-corrected and transferred to the spare block of the address obtained in SE34 and the additional program operation may be performed for a change of the address of the data page area contained in the FAT area without performing the erase operation.

After this, in SE36, it is determined whether or not all of the vacant spare addresses which have been used for data replacement of the class 1 are checked. All of the blocks in the class 1 are checked according to a sequence of SE34, SE36.

Next, in SE37, it is determined whether or not the vacant spare block of the class 0 has already been used. In this case, since all of the address bits of the class 0 are "1", the FAT address can be rewritten into a spare address without fail by additional programming. In SE38, the page is error-corrected and transferred to the spare block obtained in SE37 if the vacant spare address is not used. Further, the additional program operation may be performed for a change of the address of the data page area of the FAT area without performing the erase operation. If it is detected in SE37 that the vacant spare address is used, a vacant spare block address of the class with a higher level is searched for in SE39 and the page is error-corrected and transferred to the spare block obtained in SE37. At this time, a bit which is changed from the program state of "1" to the erase state of "0" is used for a change of the address of the data page area of the FAT area. Therefore, after data of the FAT area is temporarily saved and the data of the FAT area is erased, data of the FAT area whose address has been rewritten into the spare area is required to be programmed.

As described above, data of the FAT area is changed by additional programming and a deterioration in the FAT area caused by repeatedly performing the program and erase operations with respect to the FAT area can be prevented. Thus, a highly reliable semiconductor memory device can be realized. Further, since the probability that the erase operation is required for the FAT area can be suppressed, the page replacement operation can be performed at higher speed.

Next, the findings of the inventor of this application relating to the effect obtained by determining that the number of error bits becomes equal to or larger than the preset reference value larger than 1 and replacing the block by the spare block as in the present embodiment are explained below.

The rate of good-quality products for one bit is "p" and the probability $P_i$ containing bit errors of i bits in each page with the page length of m bits can be given by the following Poisson distribution in a range in which the number m of bits of the page length is set much larger than the number i of error bits.

$$P_i \approx \frac{(mp)^i}{i!} e^{-mp}$$

In the highly reliable semiconductor memory device, since it is naturally required to suppress occurrence of bit faults, the relation of "mp<1" is satisfied. That is, the probability $P_i$ becomes a function which rapidly decreases as the number i of error bits becomes larger.

Next, when the total number of pages in the semiconductor memory device is "n" and the number of pages containing bit errors of i bits is "$k_i$", the probability (expected value) $P_{ex}$ that the numbers of pages containing 1, 2, . . . , s bit errors are $k_1$, $k_2$, . . . , $k_s$ is expressed as follows.

$$P_{ex} = \frac{n!}{(k_1)!(k_2)! \ldots (k_s)!\left(n - \sum_{i=1}^{s} k_i\right)} p_s^{ks} \ldots p_2^{k2} p_1^{k1} p_0^{(n-\sum_{i=1}^{s} k_i)}$$

The rate of faulty products as viewed from the external I/O can be calculated by adding the expected values $P_{ex}$ based on combinations of $k_1, k_2, \ldots, k_s$ which may become bit faults. Next, the logarithms of the expected values $P_{ex}$ are derived and differentiated by "$k_i$". As a result, a point at which the expected value $P_{ex}$ becomes maximum is derived as follows with an error of ±8% or less in a case where "n" is sufficiently larger than each "$k_i$" and each "$k_i$" is equal to or larger than 1.

$$\frac{\partial}{\partial k_i} \log(P_{ex}) \approx \frac{\partial}{\partial k_i}\left[n\log n - n - \left\{\left(n - \sum_{i=1}^{s} k_i\right)\log\left(n - \sum_{i=1}^{s} k_i\right) - \left(n - \sum_{i=1}^{s} k_i\right)\right\} - k_i \times \log(k_i) + k_i - \frac{1}{2}\log(2\pi k_i) + k_i \times \log(P_i) + \left(n - \sum_{i=1}^{s} k_i\right)\log(P_0)\right]$$

$$= \log\left(\frac{P_i}{k_i} \times \frac{n - \sum_{i=1}^{s} k_i}{P_0}\right) - \frac{1}{2k_i} = 0$$

-continued $$\therefore nP_i/P_0 \approx k_i \times \exp\left(\frac{1}{2k_i}\right)$$

Therefore, the expected value of "$k_i$" becomes equal to $nP_i/P_0$ when "$k_i$" is sufficiently larger than 1. Further, the expected value of "$k_i$" is suppressed in a range of $0.6 \times nP_i/P_0$ to $nP_i/P_0$ in the case of "$k_i \geq 1$". In this case, since "$P_i$" is a function which rapidly decreases as "i" becomes larger, the expected value "$k_i$" of the number of pages which contain i error bits rapidly decreases in proportion to $(mp)^i/i!$ as "i" becomes larger.

Therefore, the number of spare blocks required for replacement can be significantly reduced by setting a large criterion value in the present embodiment in which it is determined that the number of error bits has reached a criterion value equal to or larger than 2 and the block is replaced by a spare block.

In addition, if the criterion value is set within the number of bits which can be relieved by use of ECC and when bit errors of a number equal to or less than the criterion value occur, all of the bit errors can be relieved by use of ECC. Further, information bits in which all of the errors are corrected can be output as data output from the external I/O. Therefore, the criterion value is set to the maximum value of the number of bits which can be relieved by use of ECC. If the criterion value is set to the maximum value of the number of bits which can be relieved by use of ECC, an advantage that the number of spare blocks required for replacement can be reduced can be attained.

Further, the inventor of this application found the following.

If the total number n of pages is sufficiently larger than the number $k_i$ of pages containing bit errors of i bits and when "$P_i$" is sufficiently smaller than 1, the distribution of "$k_i$" approximately follows the Poisson distribution of $(nP_i)^{ki}/(k_i)! \times \exp(-nP_i)$ based on the expression of "$P_{ex}$". Therefore, it can be considered that the dispersion of "$k_i$" is equal to the expected value of "$k_i$". Thus, the distribution of the numbers of pages containing 1, 2, ..., s bit errors is derived and $k_1$, $k_2$, ..., $k_s$ expected values and dispersion can be derived. Therefore, the number of spare blocks in which pages containing error bits of a number equal to or larger than the criterion value are replaced can be statistically calculated. For example, it can be considered that the number of pages containing t bit errors can be approximated to the normal distribution rather than the property of the Poisson distribution when the expected value of "$k_t$" is equal to or larger than five. Therefore, if spare blocks of $k_t + 3 \times (k_t)^{0.5}$ are prepared for pages containing t bit errors, all of the pages containing t bit errors can be replaced with the reliability of 99.7% or more.

Further, the inventor of this application found that the probability of occurrence of error bits as viewed from the external I/O can be reduced by statistically estimating and previously preparing spare blocks in which all of the pages containing error bits of a number equal to or larger than the criterion value can be replaced.

Assume that bit errors of the memory device according to the present embodiment irreversibly increases after shipping by repeatedly performing the program and erase operations and a bit which becomes once erroneous is not returned to a normal bit. In this case, for example, if the page replacement operation can be performed by n times when t-bit errors occur in the configuration having an ECC circuit which can correct t-bit errors in a page with the page length of m bits, the fault relieving operation equivalent to that of the configuration having an ECC circuit which can correct errors of up to $(n+1) \times t$ bits can be performed with respect to the data unit which has been subjected to the page replacement process.

In this case, as described in the section in which "$P_i$" is calculated, in the case of a random bit fault, if the probability of good bits for each bit is "p" and "mp" is sufficiently smaller than 1, the probability $P_i$ that bit errors of i bits are contained in each page with the page length of m bits is rapidly decreased in proportion to $(mp)^i/i!$ as "i" becomes larger.

Therefore, the probability that errors of a number larger than the number of bits which cannot be error-corrected will occur is reduced to $(mp)^{nt}$ times or less for data of a page which is subjected to the replacement operation n times in comparison with at least data of a page which is not subjected to the replacement operation.

Thus, when it is determined that the criterion value t which is equal to or larger than 2 is reached and all of the pages containing t or more bit errors are replaced, the rate of occurrence of error bits as viewed from the external I/O can be rapidly reduced to (mp)nt times or less.

Further, in the above description, when a spare block which is once replaced becomes faulty, it can be replaced by another spare block. If spare blocks which can be replaced n times are prepared for each page, the fault relieving operation equivalent to that of the configuration having an ECC circuit which can correct errors of up to $(n+1) \times t$ bits can be performed. In this case, the rate of occurrence of error bits is rapidly decreased in proportion to $(mp)^{nt}/(nt)!$.

As the result of careful examination, it is found that if the number of spare blocks which can be replaced by pages containing faulty bits of a number larger than the number of bits which can be corrected by use of ECC is "bk" and when the block replacement operation of the present embodiment is used, the permissible error total bit number exceeding the ECC ability can be reduced to the permissible faulty bit number, that is, $(ak+(bk \times t))$ obtained by adding $(bk \times t)$ to the permissible error total bit number "ak" exceeding the ECC ability at least when the replacement operation is not performed. Therefore, the number bk of spare blocks is added to set the relation of bk>ak'/t while the permissible error total bit number exceeding the ECC ability when the replacement operation is not performed is set to ak'. In this case, since the rate of occurrence of faulty bits is rapidly decreased in proportion to $(mp)^{nt}/nt!$, a state in which the number of error bits as viewed from the external I/O is almost zero can be realized.

Assume that the expected value of the number of spare blocks required for the second replacement operation is "$k_{2s}$", the expected value of the number of spare blocks required for the first replacement operation is "$k_s$", $k_{2s} \geq 1$ and $k_s \geq 1$. In this case, since $(k_{2s}/k_s)$ varies in proportion to $(P_{2s}/P_s)$, it is rapidly decreased in proportion to $(mp)^s$. Therefore, an increase in the chip area caused by an increase in the number of spare blocks required for the two or more replacement operations can be set sufficiently smaller than an increase in the chip area caused by an increase in the number of spare blocks required for the one or more replacement operations. Of course, if the address configuration in the spare area shown in FIG. 12 is used in a case where the spare block which has been once replaced becomes faulty and is replaced by another spare block, the additional program operation may be performed without performing the erase operation for a change of addresses in the data page area of the FAT area by using an address in the lower-level class shown in FIG. 12 for the two or more replacement operations. Thus, the high-speed replacement operation can be performed. This is a great advantage.

On the other hand, if the number of blocks to be replaced is smaller than the expected value of the number of pages exceeding the criterion value, for example, the probability element $P_{ex}$ and the number of cases wherein data pages containing errors of t or more bits which cannot be replaced by the spare blocks exist are not zero. Therefore, in this case, the probability that pages contain faulty bits becomes higher than that in a case wherein all of the pages containing the errors are replaced by at least $(mp)^{-nt}$ times and the probability of occurrence of error bits as viewed from the external I/O will be significantly increased.

For example, assume that the total number of blocks is "$n_{block}$", the maximum guaranteed value of the faulty block number after the specified maximum number of program and erase operations is "$n_{bad}$", the number of bits which can be error-corrected by use of ECC is "ECC" bit and the number of error bit criterion bits is "id" bits. Then, the average error bit state in a case where the block replacement operation is not performed can be statistically expressed by the following expression.

$$n_{bad} \le n_{block} \times \sum_{i=ECC+1}^{\infty} \frac{P_i}{P_0} = n_{block} \times \sum_{i=ECC+1}^{\infty} \frac{(mp)^i}{i!}$$

Therefore, the upper limit $mp_{max}$ of "mp" can be derived by connecting both sides of the above expression by use of an equal sign. As a result, the upper limit $n_{replace}$ of the average value of the numbers of blocks to be replaced in this embodiment can be given by the following equation.

$$n_{replace} = n_{block} \times \sum_{i=id}^{ECC} \frac{(mp_{max})i}{i!}$$

When a variation in the number of blocks is taken into consideration, the calculation may be made by considering the dispersion of "$n_{block}P_i$" as "$n_{block}P_i$" as explained in the above description and setting the reliability. In the present embodiment, if the reliability is enhanced, the number of replacement blocks larger than "$n_{replace}$" becomes necessary. When one block is divided and replaced by a page or replaced by a divided page, $n_{block}$, $n_{bad}$ and $n_{replace}$ of the above equation may be calculated by considering the block number as the page number or divided page number. The total sum of the probabilities of occurrence of bit errors which can be relieved by use of ECC can be calculated by adding the probabilities $P_{ex}$ in the respective cases.

As described above, the probability of occurrence of error bits as viewed from the external I/O can be reduced by using the configuration of the present embodiment, that is, statistically estimating and previously preparing spare blocks by which all of the pages containing error bits of a number equal to or larger than the criterion value can be replaced by use of ECC.

In this example, the ROM 111 stores the error bit reference value used for page replacement, but it can be stored as a determination value of the program of the flowchart shown in FIG. 11, for example. Of course, the error bit number determination circuit 6 can be configured by use of hardware such as a sequencer, for example.

In the example shown in FIG. 11, a method for calculating the error position locator by use of the Peterson method, but it is possible to calculate the error position locator by use of another method such as a Euclidean method or Berlekamp-Massey method.

Further, it holds true for all of the embodiments other than the present embodiment, but in the case of a Reed-Solomon (RS) code, the error position locator can be derived based on the syndrome by use of the Peterson method, Euclidean method or Berlekamp-Massey method as in the case of the BCH code. Therefore, the configuration and effect explained in the present embodiment can be realized.

Figure 15:
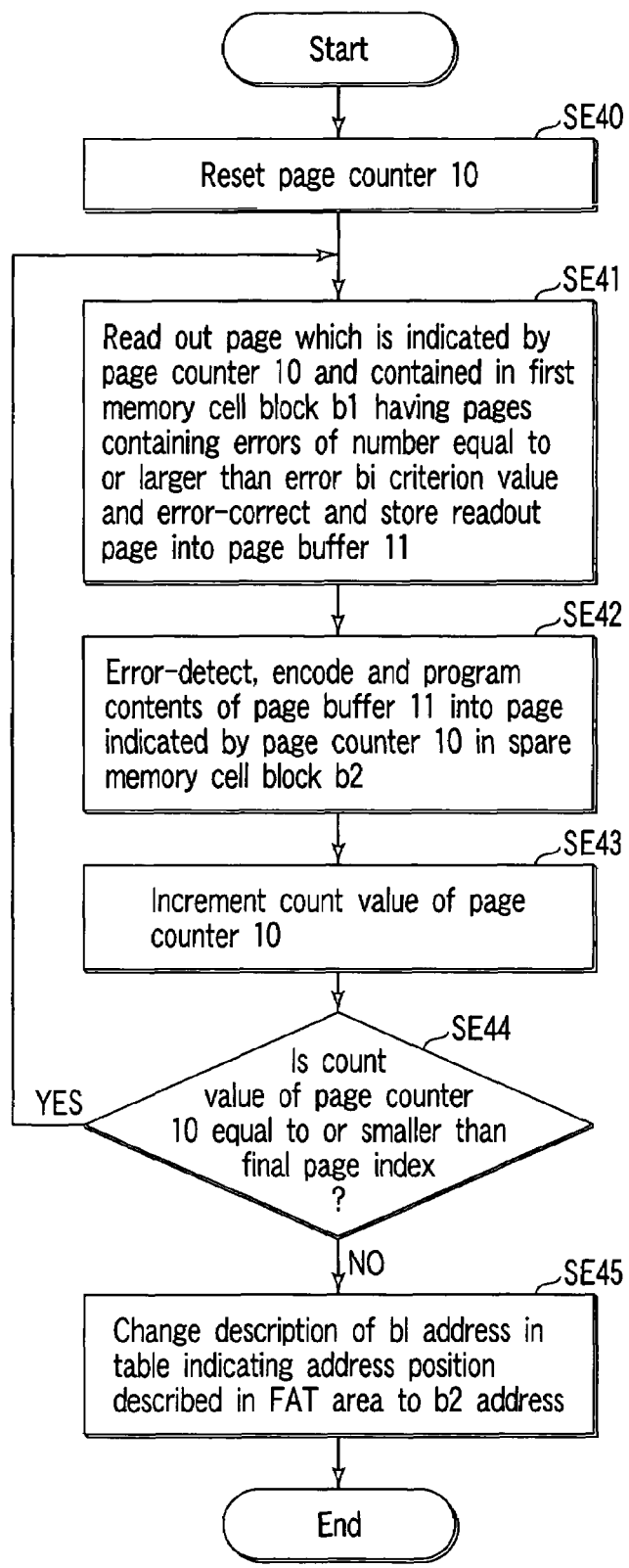
FIG. 15 is a flow diagram showing an example of the replacement operation of the data memory system according to the first embodiment of this invention.

FIG. 15 shows an example in which errors of the contents of a first memory cell block are corrected and the error-corrected data is programmed into a second memory cell block to replace data containing error bits. In this case, assume that the second memory cell block configured by a spare area has substantially the same configuration as the first memory cell block. Thus, the advantage that the area of the memory cell array is reduced and an inexpensive chip can be configured can be attained. Further, it is necessary to set the total number of pages of one block in the second memory cell block of this example larger than the total number of pages of one block in at least the first memory cell block.

First, in SE40, the page counter 10 is reset to indicate a first page.

Then, in SE41, a page indicated by the page counter 10 for the first memory cell block having pages which contain errors of a number equal to or larger than the error bit criterion value is read out, error-corrected and stored into the page buffer 11. At this time, for example, if the readout operation of the present block is indicated from the exterior of the system as required, the readout contents may be output from the external I/O.

Next, in SE42, the contents of the page buffer 11 are encoded into an error detection code and programmed into the second memory cell block of the spare area indicated by the page counter 10. A data program end flag may be programmed into another bit location of the second memory cell block after the end of programming. Thus, programming failure due to interruption of the power supply at the program time can be detected and the return sequence can be performed.

Next, in SE43, the count value of the page counter 10 is incremented by one, for example.

After this, in SE44, it is determined whether or not the page counter 10 refers to the indices of all of the pages. This is equivalent to the process for determining whether or not the index is not larger than the total number of pages contained in the first memory cell block when the sequence of SE43 for incrementing the count value of the page counter 10 by one for each time is used. In this example, the replacement method for each memory cell block is shown. However, the replacement operation can be performed for each page. In this case, the page counter 10 is not necessary. As the page address of a page which is subjected to the replacement operation in the spare block area, a page address of the spare block area is selected so that a "0" bit will correspond to the "0" or "1" bit and a "1" bit will correspond to the "1" bit with respect to the page address of the original page containing error bits of a number equal to or larger than the error bit criterion value. As a result, the FAT replacement operation of the page address can be coped with by additional programming, the erase operation is not necessary and the high-speed re-programming operation can be performed.

Figure 16:
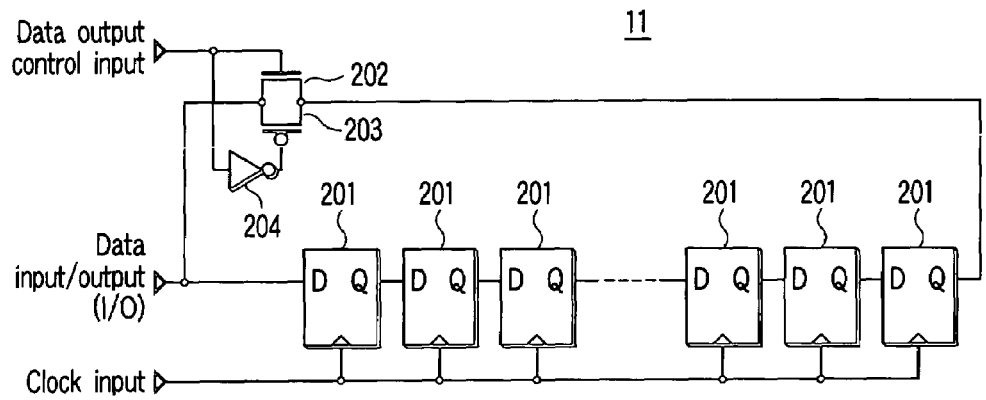
FIG. 16 is a circuit diagram showing an example of the circuit of a page buffer 11 shown in FIG. 7.

FIG. 16 shows an example of the circuit of the page buffer 11. The circuit example of FIG. 16 is an example of the page buffer 11 which temporarily stores data of k bits indicating the number of information bits.

In this example, k stages of D-type flip-flops 201 are serially connected and the output of the final stage is connected to a bi-lateral switching circuit configured by an n-channel transistor 202, p-channel transistor 203 and inverter 204. As the flip-flop 201 of this example, an edge trigger type flip-flop is used which determines the output at the instant when the clock input rises from "L" (which is conveniently set at 0V in this example) to "H" (which is conveniently set at Vcc in this example) and then keeps the output unchanged even when the clock is kept at "H" or "L" or changes from "H" to "L". Further, the bi-lateral switching circuit is a circuit in which the transistors 202, 203 are set into the conductive state when the data output control input is set at "H" and they are set into the non-conductive state when the data output control input is set at "L". The operation of the circuit is shown in FIG. 17.

Figure 17:
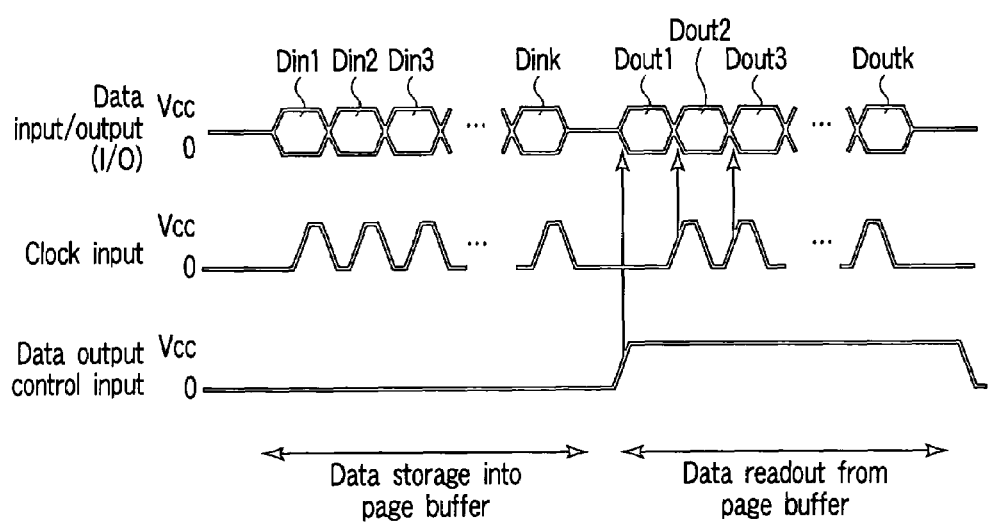
FIG. 17 is an operation waveform diagram showing an example of the operation of the page buffer 11 shown in FIG. 16.

As shown in FIG. 17, when data is stored into the D-type flip-flop 201, the data output control input is set at "L" to prevent the output of the flip-flop 201 from being supplied to the data input/output line. After digital data Din1 of Vcc ("H") or 0V ("L") is supplied to the data input/output (I/O) line, the clock is changed from "L" to "H". As a result, data in the data Din1 is held in the leftmost one of the flip-flops 201 in FIG. 16. Next, after digital data Din2 of Vcc ("H") or 0V ("L") is supplied to the data input/output (I/O) line, the clock is changed from "L" to "H". As a result, the data Din1 is transferred to and held in the second flip-flop 201 from the left end in FIG. 16 and the data Din2 is held in the leftmost flip-flop 201. After this, digital data items of up to the k-th bit are sequentially supplied to the data input/output (I/O) line and data items of "Din1, Din2, . . . , Dink" are sequentially held in the flip-flops 201 starting from the rightmost flip-flop 201 in FIG. 16 by applying the clock. Thus, the page buffer 11 holds k-bit data.

When data is read out from the page buffer 11 of this example, the data output control input is set to "H" and the output of the rightmost flip-flop 201 in FIG. 16 is supplied to the data input/output (I/O) line. As a result, the same data (which is shown as Dout1 in this example) as data of the data Din1 is supplied to the data input/output (I/O) line. At this time, the clock is changed from "L" to "H". Thus, one-bit data is transferred to and held in the rightmost flip-flop 201 in FIG. 16. As a result, the same data (which is shown as Dout2 in this example) as data of the data Din2 is supplied to the data input/output (I/O) line. After this, data items of "Din1, Din2, . . . , Dink" are sequentially supplied to the data input/output (I/O) line from the rightmost flip-flop 201 in FIG. 16 by setting the clock from "L" to "H" by (k−1) times in total. Thus, the page buffer 11 outputs data of k bits.

The present embodiment further has the following features and effects.

(1) In all of the embodiments disclosed in this specification, the error occurrence rate as viewed from the external I/O can be reduced without increasing the number of bits which can be relieved by use of ECC. Therefore, it becomes possible to reduce the circuit area and calculation time required for calculating the ECC error bit position which occurs when the number of bits which can be relieved by use of ECC is increased. When the number of bits which can be relieved by use of ECC is increased by one bit, the number of bits used by the ECC circuit is increased by at least the number of bits obtained by rounding up a fraction of $\log_2(n)$ to the nearest integer. As a result, it becomes possible to solve the problem that the code length becomes longer to increase the chip area and reduce the number of data bits which can be used by the user. Thus, a highly reliable memory device having a smaller memory cell array area can be attained.

The reliability for the service life of the memory can be ensured by preparing the vacant spare area of an amount as described in the concrete configuration of the system and replacing the memory area as viewed from the external I/O by the spare area.

Further, assume that the number of replacement spare blocks to be substituted for pages containing bits exceeding the number of bits which can be corrected by use of ECC is set to "bk", the error bit criterion value is set to "t" and the permissible error total bit number exceeding the ECC ability when the replacement operation is not performed is set to "ak'". In this case, if the number bk of spare blocks is further increased in order to set the relation of "bk>ak'/t", a state in which the number of error bits as viewed from the external I/O is almost zero can be realized. Thus, a semiconductor memory device having a reliability which cannot be attained in the prior art can be realized. Further, the number of replacement spare blocks which cannot be attained in the prior art can be decreased and an integrated circuit with a smaller area can be realized by using the error bit reference value larger than one bit. Particularly, if the total number of blocks is "$n_{block}$", the maximum guaranteed value of the number of blocks required for replacement at the time of expiration of the guaranteed service life of products or after the specified maximum number of program and erase operations is "$n_{bad}$", the number of bits which can be error-corrected by use of ECC is "ECC" bits and the number of error bit criterion bits is "id" bits, the effect of a reduction in the fault rate in the present embodiment is further enhanced by preparing the number "$n_{replace}$" of replacement blocks which is equal to or larger than at least a value expressed by the following equations.

$$n_{bad} = n_{block} \times \sum_{i=ECC+1}^{\infty} \frac{a^i}{i!}$$

$$n_{replace} = n_{block} \times \sum_{i=id}^{ECC} \frac{a^i}{i!}$$

In this case, "a" in the above equations is a variable which can be eliminated by simultaneously establishing the above equations. Further, $n_{block}$, $n_{bad}$ and $n_{replace}$ in the above equations may be calculated by considering the block number as the page number or divided page number when one block is divided and replaced by a page or by a divided page, respectively.

Further, since id≦ECC, the following equation is attained.

$$n_{replace} \geq n_{block} \times \frac{a^{ECC}}{(ECC)!}$$

(2) The probability that the block is replaced by a replacement spare block can be quantitatively calculated as [1−(the total sum of $P_{ex}$ in the condition that the error value is smaller than the criterion value in all of the pages)]. Therefore, the probability of occurrence of time required for block replacement can be derived and the performance of the system can be quantitatively ensured. This ensures that the probability of spare block replacement can be 0% and in which the system cannot be accessed from the external I/O does not occur until the number of program and erase operations reaches n1 by using natural numbers n1, n2 which satisfy the relation of n1<n2, for example. Further, the product can be ensured to attain the effect that time (tk×r) in which the system cannot be accessed from the external I/O occurs while the number of program and erase operations is set in a range of n1 to n2 if the probability of spare block replacement is set to r and time required for reprogramming is tk, for example. Thus, a semiconductor memory device whose reliability is quantitatively ensured and which is highly reliable in comparison with the conventional device can be attained.

(3) The semiconductor memory device 7 of the data memory system is configured by a plurality of semiconductor memories containing error correction bits. Only the number of memory cell arrays in the row direction is different from that of the memory circuit which contains no error correction bits and the semiconductor memory device 7 is not required to have a special circuit and means such as a data destruction detecting dedicated cell. Therefore, since the similar patterns of error correction bits and information storage bits can be closely and repeatedly arranged, a data memory system which is inexpensive and has a small chip area can be formed by use of the semiconductor memory device 7 which is the same as the conventional device. Further, in the present embodiment, the number of bits in which an error occurs for each page is detected when data is actually read out. For example, like the conventional device, when it is not necessary to read out data from the external I/O, for example, at the time of turn ON or OFF of the power supply, it is not required to read out data for refresh. Therefore, power and processing time required for data refreshing can be reduced and a larger number of errors can be detected for pages which are subjected to a large number of real read operations. Particularly, if the operations of the configuration contain the verify read operation in which it is determined whether or not the threshold voltage is set within a set range at the erase and program time, occurrence of error bits caused by the program and erase operations can be detected. Thus, a highly reliable semiconductor memory device can be attained. Further, the error detection operation is performed without fail after information bits required for error correction have occurred. Therefore, even if the statistical behaviors of so-called "tail bits" which cause error bits are changed between chips or changed with time, it is possible to correctly detect the error.

(4) The ECC circuit 100 includes a circuit which can correct error bits and can correct either a data error from "1" to "0" or a data error from "0" to "1" in the process of outputting data to the external I/O. Therefore, with this configuration, it is possible to perform data correction at the time of transfer (read-disturb) of an erase bit caused by read stress into a program state, data correction when program data is unsatisfactorily held, data correction at the time of excessive programming (over program) to a threshold value larger than the set value which becomes a problem caused in the NAND structure, and data correction at the time of erroneous programming caused by programming data into a memory cell connected to the non-selected data line.

(5) For example, as shown in FIG. 3, a memory is configured by forming the memory cells M0 to M15 corresponding to a plurality of pages between the selection gate transistors S1 and S2. In the memory, the memory cells are used as one block and data items of the memory cells M0 to M15 are simultaneously erased. Further, in the above memory, since program time for one page can be made extremely shorter than the erase time of one block, time for replacement into the spare area can be made short by forming spare blocks in which data is previously erased.

(6) In this embodiment, unlike the conventional device, actual error bits are directly detected based on data which is coded into an error correction code. Therefore, even when any one of the coded bits is a cell which is extremely weak to programming stress or readout stress, that is, a "tail bit", it can be correctly detected at the time of occurrence of the data error. Thus, the data replacement interval can be set according to the characteristic of the "tail bit" of the real memory cell and time for data replacement can be reduced by setting the data replacement interval longer.

(7) In this embodiment, the error bit detecting operation is performed by reading out data once for each page. Therefore, time for reading is kept unchanged in comparison with the conventional case wherein the error correction is not detected and the readout operation can be performed at high speed.

(8) In the data memory system according to this embodiment, the block replacement operation can be performed in a case wherein a series of operations of turn-OFF of the power supply, turn-ON of the power supply and reading of data of one page from the external data output terminal is repeatedly performed by plural times. Therefore, the number of times by which information data which is the same as information data programmed into the page can be read out can be made larger than the number of times by which information data which is the same as information data obtained by programming the operation for continuously reading out data of one page into the page can be read out since the block replacement operation can be performed. Thus, a data memory system whose reliability can be enhanced with respect to transfer (read-disturb) of an erase bit caused by read stress into a program state as viewed from the exterior of the system in comparison with a single unit of the semiconductor memory device 7 can be attained. Further, the number of repetition times of the program/erase operations can be increased and the reliability can be enhanced by performing the replacement operation of this embodiment with respect to faulty bits (over-program) which exceed the program setting value and whose frequency of occurrence is increased by repeatedly performing the program/erase operations.

(9) In this embodiment, the second memory cell block, which is a spare area, may be subjected to the erase operation before shipping, which reduces the time needed for replacement of data into the spare area.

(10) In this case, the coding circuit and decoding circuit for cyclic BCH codes which can be used for 2-bit error correction are shown. However, another code system, for example, a general BCH code and M-series code, convolutional code or difference set cyclic code can be used and the combination of the above codes can be used. In order to reduce the number of wirings of the second internal I/O line and the number of wirings of the first internal I/O line, it is preferable to use a cyclic code in which information bits are given in a time-series form and the coding and decoding operations can be performed by use of a smaller circuit scale. Further, for example, a so-called byte code having $2^r$ elements obtained by gathering code words of r bits can also be used. Also, for example, a Reed-Solomon code which is a byte code in the BCH code system can be used. In the case of a byte code, a byte error indicating that an error occurs in any one of the elements is detected and then it is determined whether the bit which causes an error is "1" or "0" for each bit of the data in the byte by comparing the byte before error correction with the byte after error correction for each bit. After this, for example, if the result of the above determination indicates that an error occurs in at least one bit, the replacement operation may be performed. Further, as the convolutional code, for example, one-bit error correctable Wyner-Ash code, burst error correctable Iwadare code or Hagelbarger code can be used.

(11) in the sequence shown in FIG. 15, the sense amplifier/data register circuit 46 can obtain the copy simply by storing information of one page and it is not necessary to read out data from the external I/O to the exterior or provide an external temporary memory. Therefore, time for data transfer via the external I/O can be omitted, the sequence can be performed at high speed and power required for driving the external I/O circuit can be reduced.

Second Embodiment

The second embodiment is almost the same as the first embodiment except that the sequence and circuit configuration used when errors are relieved by use of ECC are different from those of the first embodiment. In the second embodiment, the same portions and the same voltage relation as those in the first embodiment are denoted by the same reference symbols or selectively omitted and the repetitive explanation thereof is omitted.

Figure 18:
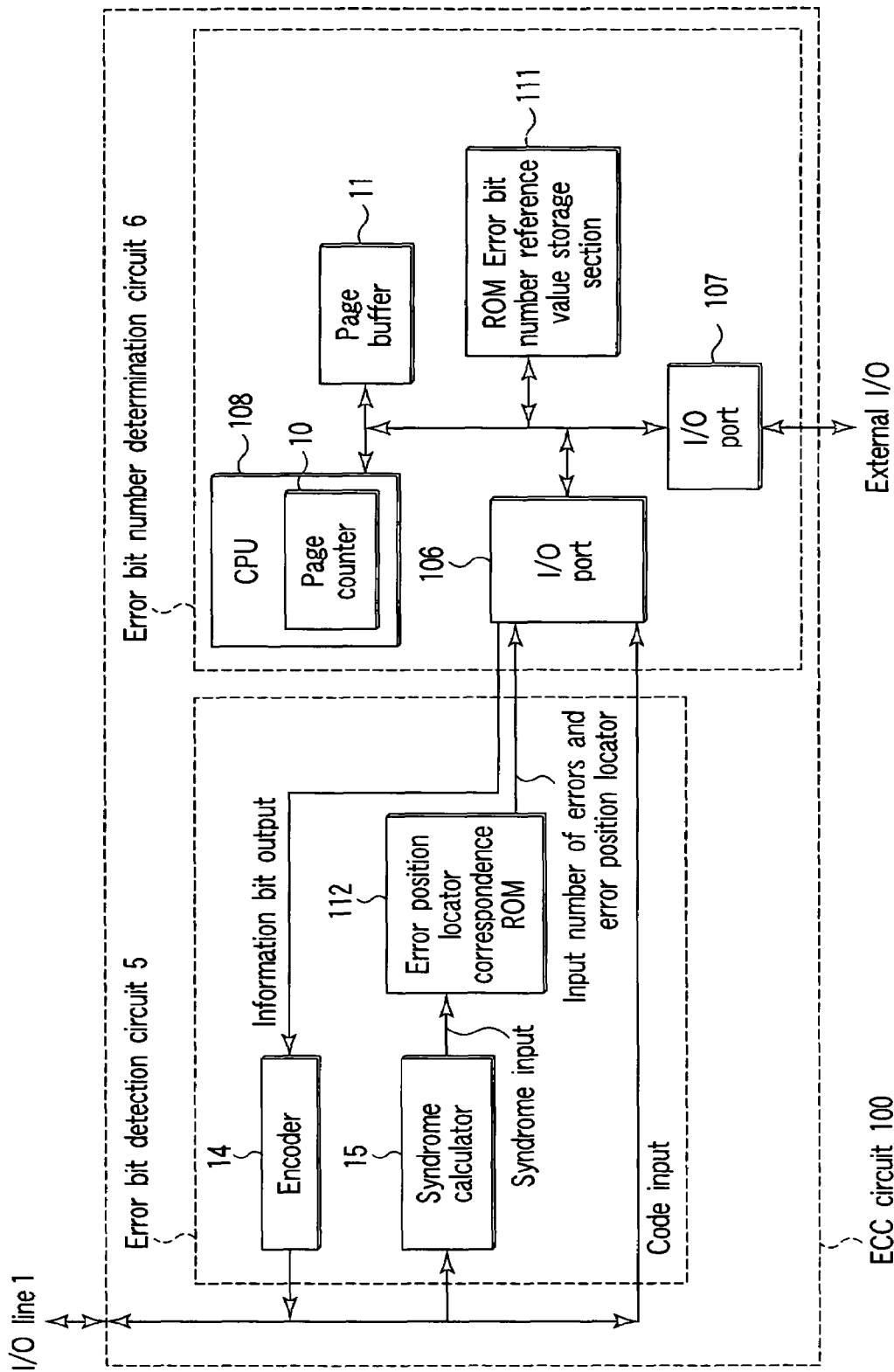
FIG. 18 is a block diagram showing an example of the configuration of an ECC circuit 100 of a data memory system according to a second embodiment of this invention.

FIG. 18 is a block diagram showing an example of the block of an ECC circuit 100 which a device according to the second embodiment has.

As shown in FIG. 18, the ECC circuit 100 provided in the device according to the second embodiment inputs outputs (syndromes) $s1, s3, \ldots, s_{2t-1}$ (syndrome inputs) of a syndrome calculator 15 to an error position locator correspondence ROM 112. The error position locator correspondence ROM 112 outputs error position locators $\alpha^{-i}, \alpha^{-j}, \ldots, \alpha^{-n}$ (error position locator inputs) and information bits indicating the number of error bits. The above outputs are input to an I/O port 106. The error bit number determination circuit 6 can derive an error-corrected code output by inverting bits of the error positions indicated by the error position locator which are the same in number as the number of error bits. In this example, the ROM of an error bit number reference value storage section 111 stores the reference value of error bits to be subjected to the page replacement. However, for example, like the ROM 111 of the first embodiment, it can be configured to store the determination value of the program shown in the flowchart of FIG. 11. Of course, for example, the error bit number determination circuit 6 can be configured by use of hardware such as a sequencer.

Figure 19:
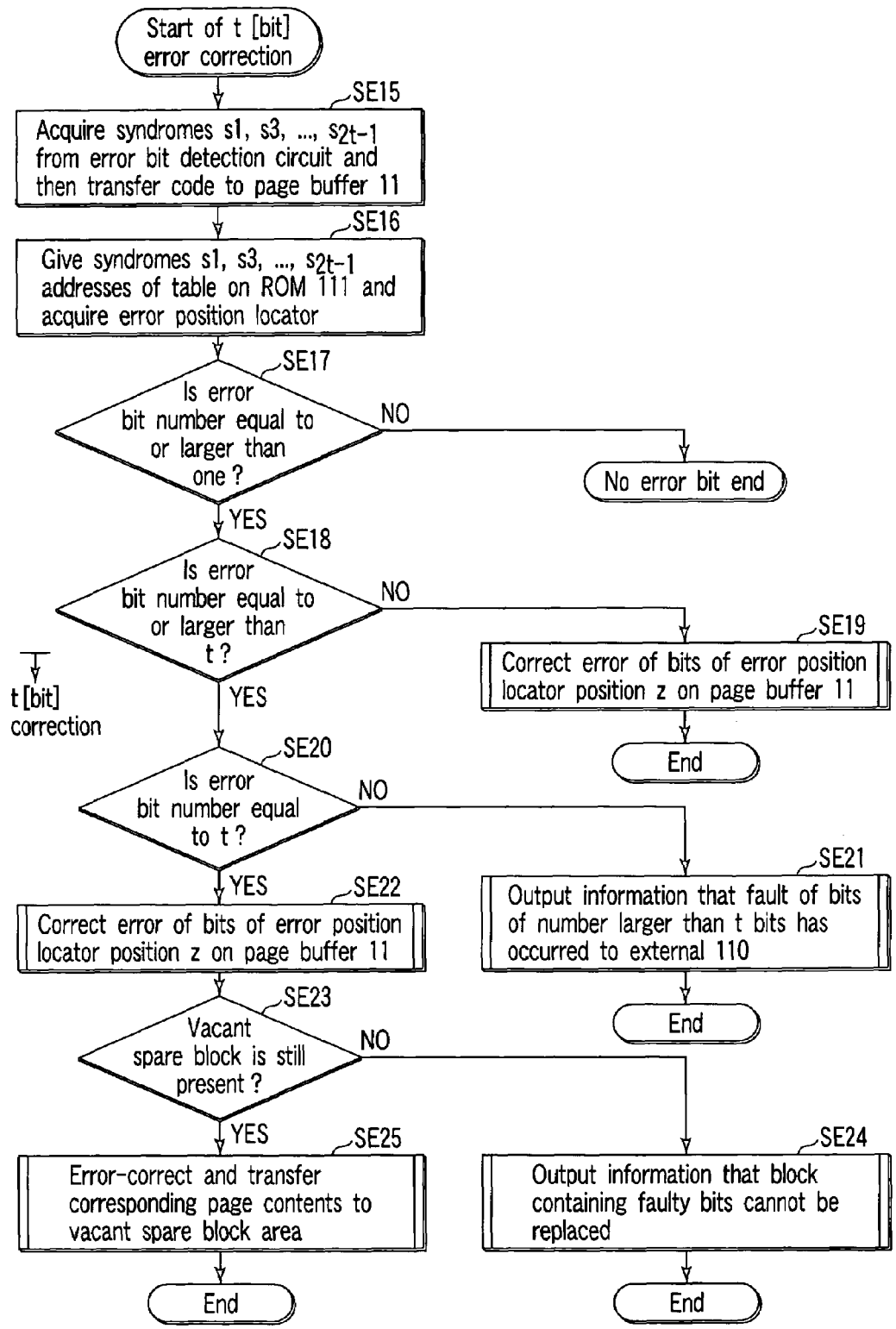
FIG. 19 is a flow diagram showing an example of the replacement operation of the data memory system according to the second embodiment of this invention.

FIG. 19 is a flow diagram showing an example of the operation of the device according to the second embodiment.

FIG. 19 shows an example in which page data is corrected by use of ECC and selectively replaced into a vacant spare block for each page when error determination bits of a number larger than one bit or errors of t bits in this example occur at the read time. Further, in this example, a method for deriving the error bit position at high speed by previously forming a correspondence table between the syndromes $s1, s3, \ldots, s_{2t-1}$ and the error position locators on the ROM 111 is described.

First, in SE15, the syndromes $s1, s3, \ldots, s_{2t-1}$ are transferred from the error bit detection circuit 5 to the error bit number determination circuit 6 via the I/O port 106. Further, a reception code is transferred from the error bit detection circuit 5 to the page buffer 11 of the error bit number determination circuit 6 via the I/O port 106.

Next, in SE16, the syndromes $s1, s3, \ldots, s_{2t-1}$ are given to the address input of the "syndrome→error position locator correspondence table" on the ROM 111 and the error position locator and the number of errors are acquired as data. An example of the correspondence table which is formed to derive the error position locator based on the syndrome is shown in FIG. 20. In this example, as the address inputs, t sets of syndromes which are the roots on the Galois body $GF(2^4)$, that is, the syndromes $s1, s3, \ldots, s_{2t-1}$ are given. Therefore, the number of input address bits is $4 \times t$ bits in this example.

Further, error position locators $\alpha^{-i}, \alpha^{-j}, \ldots, \alpha^{-n}$ which are the roots on the Galois body $GF(2^4)$ and information bits indicating the number of error bits are output. For example, if the number of information bits indicating the number of error bits is equal to a number (cn) obtained by rounding up a fraction of $\log_2(t+1)$ to the nearest integer, the number of error bits based on the binary system can be output. Since BCH is a linear code, no error bit is detected when the syndromes are all "0".

As the address number of a one-bit error, addresses of $_{q-1}C_1 = q-1$ are used and the error position locator $\alpha^{-i}$ is output if the number of elements of the Galois body is q (16 in the case of $GF(2^4)$). Since the inverse element of the syndrome s1 is $\alpha^{-i}$, it can be calculated directly from the syndrome s1 by use of the inverse element table ROM. In this case, $i, j, \ldots, n$ in FIG. 20 are integers in a range of 0 to $(q-1)$ which are different from one another. Further, (e1, f1, g1, h1), (e2, f2, g2, h2), $\ldots$, (et, ft, gt, ht) are vector representations of the syndromes $s1, s3, \ldots, s_{2t-1}$ and (a, b, c, d) may be a desired value of the error position locator output which is expressed by use of the vector representation.

Likewise, as the address number of a two-bit error, addresses of $_{q-1}C_2 = (q-1)(q-2)/2$ are used and two error position locators $\alpha^{-i}, \alpha^{-i}$ are output. Instead of this, if the first bit error position locator $\alpha^{-i}$ is known, the second bit error position locator becomes $\alpha^{-j} = 1/(s1+1/\alpha^{-i})$. Therefore, the second bit error position locator becomes $\alpha^{-j}$, and can be easily calculated if the inverse element table ROM is used. Thus, only one locator may be used without causing any problem. The inverse element table ROM may be contained in the error bit number determination circuit 6. The operation speed can be enhanced by containing the inverse element table ROM in the error bit number determination circuit 6. In this case, the inverse element table ROM is formed on the ROM 111, for example.

Likewise, if "k" is an integer in a range of 1 to t, as the address number of a k-bit error, addresses of $_{q-1}C_k$ are used and k error position locators $\alpha^{-i}, \alpha^{-j}, \ldots, \alpha^{-k}$ are output. Instead of this, if the first bit to (k−1)th bit error position locators $\alpha^{-i}, \alpha^{-j}, \ldots, \alpha^{-(k-1)}$ are known, the k-th bit error position locator becomes $\alpha^{-k} = 1/(s1+1/\alpha^{-i}+ \ldots +1/\alpha^{-(k-1)})$. Therefore, the second bit error position locator becomes $\alpha^{-j}$, and can be easily calculated if the inverse element table ROM is used. In the same manner as described above, as the correspondence table up to the t-th bit, as shown in FIG. 20, outputs of the error position locators may be set with respect to addresses of one, $_{q-1}C_1, _{q-1}C_2, \ldots, _{q-1}C_t$ in the case of (0-bit error output), (one-bit error output), (two-bit error output), $\ldots$, (t-bit error output). In the case of other addresses, "error bits of number exceeding t bits" may be output. Further, as the output data bit number, cn, $(4 \times 1+cn), (4 \times 2+cn), \ldots, (4 \times t+cn)$ may be prepared for (0-bit error output), (one-bit error output), (two-bit error output), $\ldots$, (t-bit error output) in the example of the Galois body $GF(2^4)$. For example, if an error of up to two bits is corrected by use of ECC, t=2. In the example of the same faulty bit relieving condition as in FIG. 11 in which q=16, outputs of the error position locators are set with respect to addresses of $(1+_{16-1}C_1 +_{16-1}C_2) = 1+15+105 = 121$. At this time, 2, 6, 10 bits may be prepared as the output data bit number for 0-bit fault, 1-bit fault, 2-bit fault. In this case, as the data number of the ROM 111, a ROM data area of at least $1 \times 2 + 15 \times 6 + 105 \times 10 = 1142$ bits may be prepared. Further, if the inverse element ROM is used, cn, cn, $\{4 \times (2-1)+cn\}, \ldots, \{4 \times (t-1)+cn\}$ may be prepared for (0-bit error output), (1-bit error output), (2-bit error output), $\ldots$, (t-bit error output) in the example of the Galois body $GF(2^4)$. In this case, outputs of the error position locators are set with respect to the 121 addresses and 2, 2, 6 bits may be prepared as the output data bit number for 0-bit fault, 1-bit fault, 2-bit fault. At this time, as the data number of the ROM 111, a ROM data area of at least 1×2+15×2+105×6=662 bits may be prepared. With a method using the inverse element table ROM and conversion table ROM 111, even if the data number of 16 bits required for the inverse element table ROM is added, the data number becomes 678 bits and the required ROM area can be kept small.

It is determined in SE17 whether the bit error is equal to or larger than one based on the number of errors and error position locators thus derived. Specifically, this can be attained by determining that the bit error is equal to or larger than "001" based on the binary notation in the data bits shown in the output example of the number of errors in FIG. 20. If it is smaller than "001", that is, it is "000", no error bit is detected. Therefore, the first seven bits of the code bits are output as information bits. When one or more bit errors are detected (Y), the process proceeds to SE18.

In SE18, it is determined whether the bit error is equal to or larger than t. Specifically, this can be attained by determining that the bit error is equal to or larger than the binary representation of t bits, for example, "110" based on the binary notation in the data bits shown in the output example of the number of errors in FIG. 20. If it is smaller than "110", the bit error is in a range of one bit to (t−1) bit (N). In this case, the process proceeds to SE19. In SE19, for example, a bit in the position indicated by the error position locator on the page buffer 11 is inverted and error-corrected and then correct data is output from the external I/O. Further, the data bit is equal to or larger than "110", the bit error is equal to or larger than t bits (Y). In this case, the process proceeds to SE20.

In SE20, whether or not the bit error is an error of t bits is determined. Specifically, this can be attained by determining that the bit error is equal to the binary representation of t bits, for example, "110" based on the binary notation in the data bits shown in the output example of the number of errors in FIG. 20. When the bit error contains t or more bits, error correction cannot be made (N). Therefore, in this case, information indicating that the bit fault exceeding t bits has occurred, that is, the bit fault which cannot be error-corrected has occurred is output to the external I/O in SE21. On the other hand, if the bit error contains t bits, it is considered in SE22 that an (i+1)th bit, (j+1)th bit, . . . , and (n+1)th bit counted from the finally input bit among 15 bits are error bits and bits in the positions of the t error bit locators are bit-inverted and corrected.

Next, in SE23, whether an available spare block area is present or not is determined. For this purpose, for example, a storage area which previously stores usable spare block addresses is prepared in the FAT area and the spare block addresses of spare blocks used are stored into the storage area. That is, in SE23, it is possible to confirm whether or not the available spare block areas are present by checking the addresses stored in the storage area. As the block replacement method, the method described in the first embodiment may be used. Next, if it is determined in SE23 that "a vacant spare block area is present" (Y), the page contents are error-corrected and transferred to the vacant spare block area in SE25. After the above operation, the operation of replacing the address of the FAT area into the vacant spare block may be performed.

Further, if it is determined in SE23 that "no vacant spare block area is present" (N), a signal indicating that no vacant spare block area is present is output from the external I/O in SE24. After the above operation, the operation of reprogramming the page contents into the original memory block address may be performed.

Since the operation shown in FIG. 19 uses the method for referring to the correspondence table of the error position locators, the error position can be detected at higher speed and data can be converted at higher speed in comparison with a case of the first embodiment. Of course, as described in the present embodiment, a method for keeping small the capacity of the correspondence table of the error position locators may be used in combination with the inverse element table ROM. In this case, a memory having small ROM capacity necessary for ECC correction and having a relatively high-speed operation can be realized.

Modification of Second Embodiment

Next, a modification of the second embodiment is explained.

Figure 21:
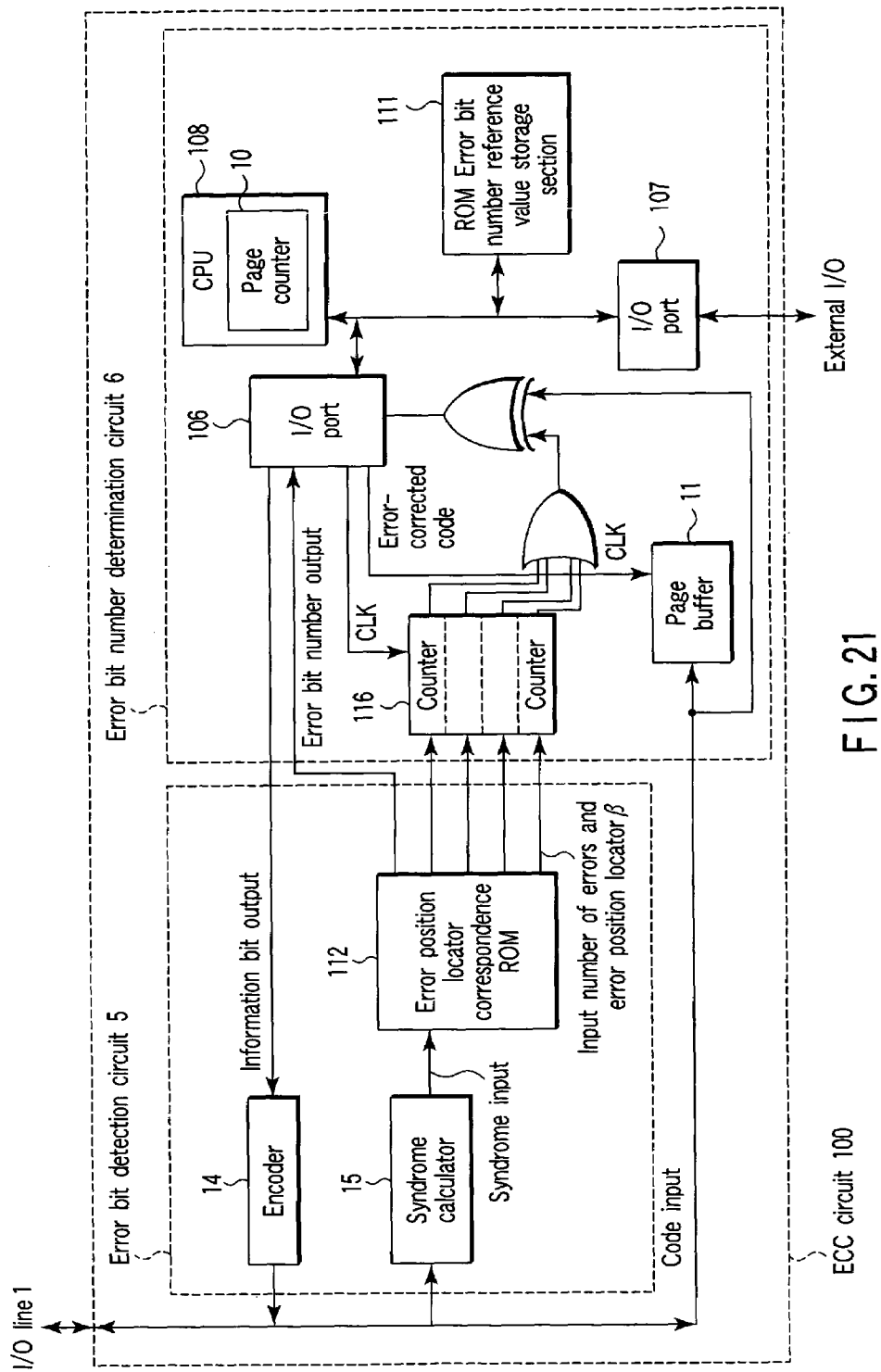
FIG. 21 is a block diagram showing an example of the configuration of an ECC circuit 100 of a data memory system according to a modification of the second embodiment of this invention.

FIG. 21 is a block diagram showing an example of the block of the ECC circuit 100 provided in a device according to the modification of the second embodiment. Further, an example of outputs of the error position locators of a ROM and syndrome inputs used in the device according to the modification of the second embodiment is shown in FIG. 22. The ROM of the modification is basically the same as the ROM of the second embodiment. However, in the ROM, outputs (syndromes) s1, s3, $s_{2t-1}$ of the syndrome calculator 15 are input to an error position locator correspondence ROM 112 and error position locators $\beta^i, \beta^j, \ldots, \beta^n$ and information bits indicating the number of error bits are output. Further, (abcd) in FIG. 22 is larger than the maximum value of the code length represented in the binary notation or is an address representation which becomes (0000). In this case, for example, β is not an element on the Galois body and may be an address representation of the error position bit represented by a normal binary number. That is, the locator $\beta^i$ indicating the i-th bit error position and the locator $\beta^{i+1}$ indicating the (i+1)th bit error position are represented by an address representation so as to be incremented or decremented by one in a binary fashion. For example, if the error bit is an i-th bit counted from the first input error position, "$\beta^{i}$" may be indicated by an address representation of the error position bit represented by use of the binary number of "i". For example, if the second bit is an error, it may be set to (0010) in the case of "i=2" and it may be set to (0001) in the case of "i=1". In this modification, for example, the output is used as an initial value setting input of t counters 116. By supplying a clock input CLK, the count value of the counter 116 is reduced by one bit at a time and is prevented from becoming equal to or lower than (0000). In this case, a circuit (corresponding to the OR circuit connected to the output of the counter in FIG. 21) is designed to output "1" when the count value of any one of the t counters 116 becomes (0001). When the output thereof is "1", a code having error bits corrected can be attained in the output range of the code bits by inverting the output of the buffer (by use of the exclusive OR circuit in FIG. 21). In this modification, the error bit number determination circuit 6 of the second embodiment can be configured only by a hardware. Therefore, a code output which is error-corrected at high speed can be attained by inverting the bit of the error position according to the number of error bits without using a program of a software containing the repetition process. For example, all of the codes are stored in the page buffer 11 when the syndrome calculation by the syndrome calculator 15 is ended. Therefore, in this modification, an error-corrected code can be instantly attained by supplying a clock input CLK to the page buffer 11 and counters 116 after elapse of the output delay time of the error position locator correspondence ROM 112. Further, in the ROM 111, the reference value of the error bit used for page replacement is stored. However, the reference value can be stored as a determination value of the program of the flowchart shown in FIG. 11 in the same manner as in the circuit shown in FIG. 7 of the first embodiment, for example.

Thus, in the device according to the second embodiment and the device according to the modification of the second embodiment, the same features and effects as those of the first embodiment, for example, the features and effects described in (1) to (11) can be attained.

Third Embodiment

Figure 23:
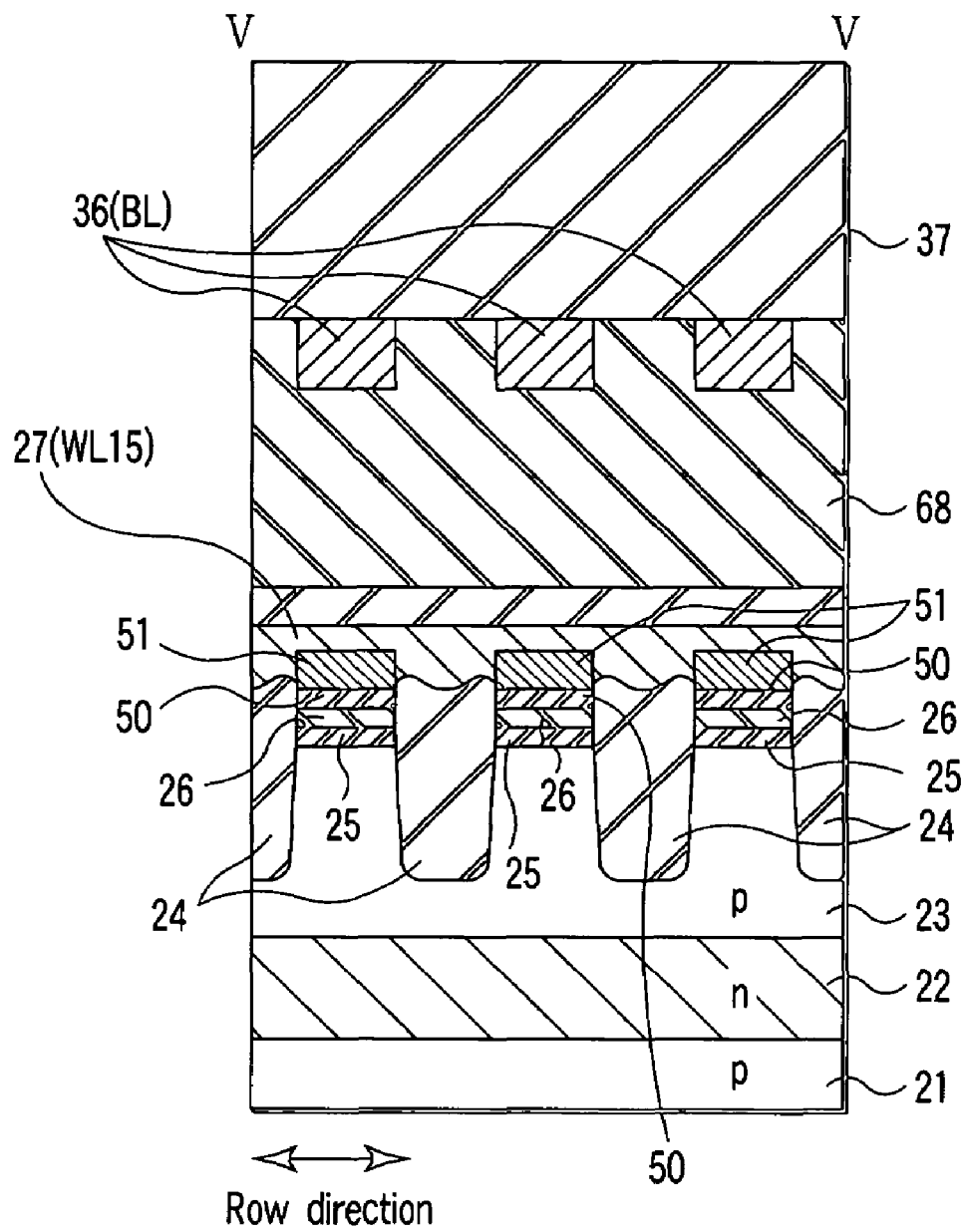
FIG. 23 is a cross sectional view showing an example of the cross section of a memory cell in a row direction which is provided in a data memory system according to a third embodiment of this invention.
Figure 24:
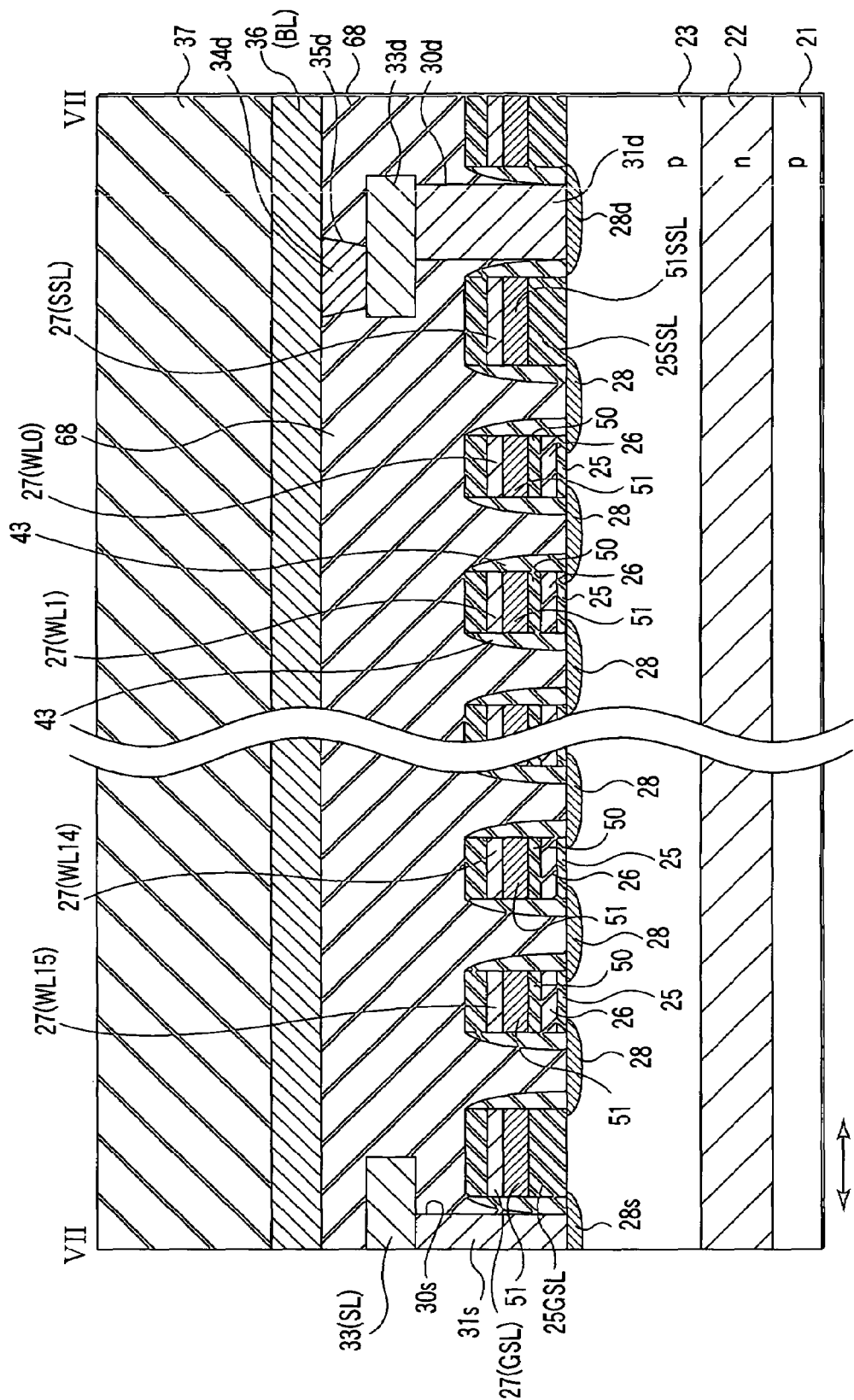
FIG. 24 is a cross sectional view showing an example of the cross section of a memory cell in a column direction which is provided in the data memory system according to the third embodiment of this invention.

FIGS. 23, 24 are cross sectional views each showing an example of the cross section of a memory cell which a device according to a third embodiment has. The cross section shown in FIG. 23 corresponds to the cross section shown in FIG. 5 of the first embodiment and the cross section shown in FIG. 24 corresponds to the cross section shown in FIG. 6. The plane pattern is the same as the plane pattern shown in FIG. 4 of the first embodiment and is omitted in the present embodiment.

In the third embodiment, the NAND cell array block 49 having the floating gate type MOS transistors explained in the first embodiment is replaced by a NAND cell array block 49 having an M-NO—S or M-ONO—S transistor.

As shown in FIGS. 23, 24, like the first embodiment, non-volatile memory cells are serially connected. The nonvolatile memory cell of the present embodiment is a so-called M-NO—S EEPROM cell or M-ONO—S EEPROM cell (which is hereinafter referred to as an M-ONO—S cell) having SiN or SiON as a charge storage layer 26. One end of the series-connected M-ONO—S cells is connected to a data transfer line 36(BL) via a selection transistor and the other end thereof is connected to a common source line 33(SL) via a selection transistor. The M-ONO—S cells and selection transistors are formed on a p-type silicon region 23. The impurity concentration, for example, boron concentration of the p-type silicon region 23 is set in a range of $10^{14}$ cm$^{-3}$ to $10^{19}$ cm$^{-3}$ as in the first embodiment. For example, the p-type silicon region 23 is electrically isolated from a p-type silicon substrate 21 by use of an n-type silicon region 22. Thus, potential can be applied to the p-type silicon region 23 independently from the p-type silicon substrate 21 and the load of the booster circuit at the erase time can be reduced and the power consumption can be suppressed as in the first embodiment. Tunnel insulating films 25 are formed on portions of the p-type silicon region 23 on which the memory cells are formed and gate insulating films $25_{SSL}$, $25_{GSL}$ are formed on portions of the p-type silicon region 23 on which the selection transistors are formed. An example of the tunnel insulating film 25 in the present embodiment is a silicon oxynitride film or silicon oxide film having a thickness of 1 nm to 10 nm. One example of the gate insulating films $25_{SSL}$, $25_{GSL}$ is a silicon oxynitride film or silicon oxide film having a thickness larger than that of the tunnel insulating film 25. One example of the thickness of the gate insulating films $25_{SSL}$, $25_{GSL}$ is set in the range of 3 nm to 15 nm, for example. Charge storage layers 26 are formed on the respective tunnel insulating films 25. One example of the charge storage layer 26 in this embodiment is a silicon oxynitride film or silicon nitride film having a thickness of 3 nm to 50 nm. Block insulating films (inter-gate insulating films) 50 are formed on the respective charge storage layers 26. One example of the block insulating film 50 is formed of $Al_2O_3$, HfAlO, HfSiO, ZrSiO, HfSiON, ZrSiON or a silicon oxide film having a thickness of 2 nm to 10 nm. Polysilicon layers 51 are formed on the respective block insulating films 50 and polysilicon layers $51^{SSL}$, $51_{GSL}$ are formed on the respective gate insulating films $25_{SSL}$, $25_{GSL}$. Each of the polysilicon layers 51, $51_{SSL}$, $51_{GSL}$ has a thickness in the range of 10 nm to 500 nm, for example, and contains phosphorus, arsenic or boron with an impurity concentration of $10^{19}$ cm$^{-3}$ to $10^{21}$ cm$^{-3}$. The polysilicon layers 51, $51_{SSL}$, $51_{GSL}$ may be formed as required. Control gates 27(WL0 to WL15) are formed on the polysilicon layers 51, control gates 27(SSL) are formed on the polysilicon layers $51_{SSL}$ and control gates 27(GSL) are formed on the polysilicon layers $51_{GSL}$. Like the first embodiment, one example of the control gate 27 has a thickness of 10 nm to 500 nm, for example, and is formed of polysilicon or a stack structure of metal silicide and polysilicon containing phosphorus, arsenic or boron with an impurity concentration of $10^{17}$ cm$^{-3}$ to $10^{21}$ cm$^{-3}$. One example of the metal silicide is WSi, NiSi, MoSi, TiSi, CoSi, for example. If the concentration of phosphorus, arsenic or boron of the polysilicon layers 51, $51_{SSL}$, $51_{GSL}$ and/or control gates 27(WL0 to WL15) is set equal to or higher than $10^{19}$ cm$^{-3}$, the polysilicon layers 51 and/or control gates 27(WL0 to WL15) can be prevented from being depleted and an electric field applied to the ONO laminated film (block insulating film 50 or charge storage layer 26) can be made stronger and an increase in the erase time or program time can be suppressed.

For example, the control gates 27(WL0 to WL15) configure the data selection lines WL0 to WL15 shown in FIG. 2. The data selection lines WL0 to WL15 each connect the adjacent memory cell blocks 49, for example, and are formed to extend in the row direction from one end to the other end of the memory cell array 1.

For example, the control gates 27(SSL, GSL) configure the block selection lines SSL, GSL shown in FIG. 2. The block selection lines SSL, GSL each connect the adjacent memory cell blocks 49, for example, and are formed to extend in the row direction from one end to the other end of the memory cell array 1.

Like the first embodiment, in the gate structure of the present embodiment, the side walls of the charge storage layers 26 and the side walls of the p-type silicon region 23 are covered with an insulating film 24. Therefore, the side walls (side walls of the shallow grooves) of the p-type silicon region 23 are not exposed to the exterior and the charge storage layers 26 can be suppressed from being formed in portions lower than the p-type silicon region 23. Thus, like the first embodiment, in the present embodiment, concentration of the electric field can be suppressed, formation of parasitic transistors can be suppressed and occurrence of a Sidewalk phenomenon can be suppressed.

Side wall insulating films 43 are formed on both of the side walls of each gate structure. Like the first embodiment, one example of the side wall insulating film 43 is a silicon nitride film or silicon oxide film having a thickness of 5 nm to 200 nm, for example. In this case, n-type diffusion layers 28, $28_d$, $28_s$ are formed in portions of the p-type silicon region 23 which lie under portions between the respective gate structures. The n-type diffusion layers 28, $28_d$, $28_s$ are source electrodes or drain electrodes of the memory cells or selection transistors. For example, the n-type diffusion layers 28, $28_d$, $28_s$ contain phosphorus, arsenic or antimony with the surface concentration of $10^{17}$ cm$^{-3}$ to $10^{21}$ cm$^{-3}$ and formed in a depth of 10 nm to 500 nm.

Each of the memory cells of the present embodiment, for example, M-ONO—S cells is configured by the n-type diffusion layers 28, tunnel insulating film 25, charge storage layer 26, block insulating film 50 and control gate 27. A conductive layer, for example, polysilicon layer 51 is formed between the block insulating film 50 and the control gate 27 as required. One example of the gate length of the M-ONO—S type EEPROM cell is a range of 0.01 μm to 0.5 μm, for example.

The selection transistors are configured by the n-type diffusion layer 28, $28_d$, $28_s$, gate insulating films $25_{SSL}$, $25_{GSL}$ and control gates 27(SSL, GSL). Conductive layers, for example, polysilicon layers 51 are respectively formed between the gate insulating film $25_{SSL}$ and the control gate 27(SSL) and between the gate insulating film $25_{GSL}$ and the control gate 27(GSL) as required. One example of the gate length of the selection transistor is a range of 0.02 μm to 1 μm, for example. If the gate length of the selection transistor is set larger than that of the M-ONO—S type EEPROM cell, the ON/OFF ratio at the block selection time and at the block non-selection time can be set high. This is effective in suppressing occurrence of erroneous program/readout operations.

The present embodiment indicates a NAND circuit and the M-ONO—S cells and selection transistors are serially connected. Therefore, the n-type diffusion layers 28, $28_d$, $28_s$ are commonly used by the adjacent M-ONO—S type cells, the M-ONO—S type cell and the selection transistor adjacent thereto, and the adjacent selection transistors.

The n-type diffusion layers $28_d$ is connected to a corresponding one of data transfer lines 36(BL) via a contact $31_d$, intermediate wiring $33_d$ and contact $34_d$. For example, the data transfer lines 36(BL) configure the data transfer lines BL1a to BL2k shown in FIG. 2. For example, the data transfer lines BL1a to BL2k connect the adjacent memory cell blocks 49 and are formed to extend in the column direction from one end to the other end of the memory cell array 1. Examples of a material of the data transfer line 36(BL) are tungsten, tungsten silicide, titanium, titanium nitride or aluminum.

The n-type diffusion layer $28_s$ is connected to a corresponding one of source lines 33(SL) via a contact $31_s$. For example, the source lines 33(SL) configure the source lines SL shown in FIG. 2. For example, the source lines SL connect the adjacent memory cell blocks 49 and are formed to extend in the row direction from one end to the other end of the memory cell array 1. In this case, the n-type diffusion layer $28_s$ can be used as the source line SL by forming the n-type diffusion layer $28_s$ to connect the adjacent memory cell blocks 49 and extend in the row direction from one end to the other end of the memory cell array 1.

The contacts $31_s$, $31_d$, $34_d$ are formed in openings $30_s$, $30_d$, $35_d$ formed in an inter-level insulating film 68. Examples of a material of the contacts $31_s$, $31_d$, $34_d$ are n-type or p-type polysilicon, tungsten, tungsten silicide, aluminum, titanium nitride or titanium, or a laminated structure of the above conductive materials. Examples of a material of the inter-level insulating film 68 are a silicon oxide or silicon nitride. An insulating film protection layer 37 or upper wiring layers (not shown) are formed on the inter-level insulating film 68 and data transfer lines 36(BL). Examples of a material of the insulating film protection layer 37 are silicon oxide, silicon nitride or polyimide. One example of a material of the upper wiring layer is tungsten, aluminum or copper.

According to the third embodiment, since the M-ONO—S type cell is used, the advantage that the program voltage and erase voltage can be lowered in comparison with the floating gate type cell according to the first embodiment can be attained in addition to the advantage obtained in the first embodiment. Thus, since the voltages can be lowered, the dielectric breakdown voltage can be kept sufficiently high even if the element-element separation interval is narrowed and the gate insulating film is made thin. Therefore, the area of the circuit to which high voltage is applied can be reduced and the chip area can be easily reduced.

Further, the thickness of the charge storage layer 26 can be made thin, for example, it can be set to 20 nm or less and the aspect ratio of the gate structure can be made small in comparison with the floating gate type cell. Since the aspect ratio of the gate structure can be made small, the size-controllability of the gate structure can be enhanced. Further, the burying property of the inter-level insulating film 68 into between the gate structures is enhanced and the dielectric breakdown voltage can be enhanced.

Further, the process for forming the floating gates and the process for forming slits which separate the floating gates in the row direction, for example, can be made unnecessary unlike the case of the floating gate type cells. Therefore, the time needed for the manufacturing process can be shortened.

The charge storage layer 26 is an insulator and charges are trapped in the charge trap unlike the case of the floating gate type cells. Therefore, charges are difficult to be removed and, for example, it becomes possible to attain high resistance to radioactive rays. Further, even if the side wall insulating film 43 is made thin, none of the charges trapped in the charge trap are removed and the preferable charge holding characteristic can be maintained.

In addition, since the charge storage layer 26 can be formed in alignment with the p-type silicon region 23, the capacitance between the charge storage layer 26 and the p-type silicon region 23 can be made uniform. Therefore, a variation in the capacitance between the memory cells can be reduced.

Fourth Embodiment

FIG. 25 is a block diagram showing an example of the configuration of a cell array section and sense amplifier section of a data memory system according to a fourth embodiment of this invention. The block diagram of FIG. 25 corresponds the block diagram of FIG. 2.

For example, in the fourth embodiment, the NAND cell array block 49 explained in the first embodiment is replaced by a virtual ground cell array block 49', for example. Also, assume in this example that the memory cell is a M-NO—S type EEPROM cell or M-ONO—S type EEPROM cell explained in the third embodiment.

As shown in FIG. 25, the virtual ground cell array blocks 49' are arranged in a memory cell array 1. Each of the cell array blocks 49' includes a nonvolatile memory cell connected between one of first data transfer lines BL (BL1a, BL2a, . . . , BL1k, BL2k) and a corresponding one of second data transfer lines BL (BL1a', . . . , BL1k'). The second data transfer lines BL (BL1a', . . . , BL1k') function as source lines, for example.

The other circuit configuration and circuit connection are the same as those of the cell array section and sense amplifier section shown in FIG. 2. Therefore, the same reference symbols are attached to the same portions as those of FIG. 2 and the explanation thereof is omitted here.

Figure 27:
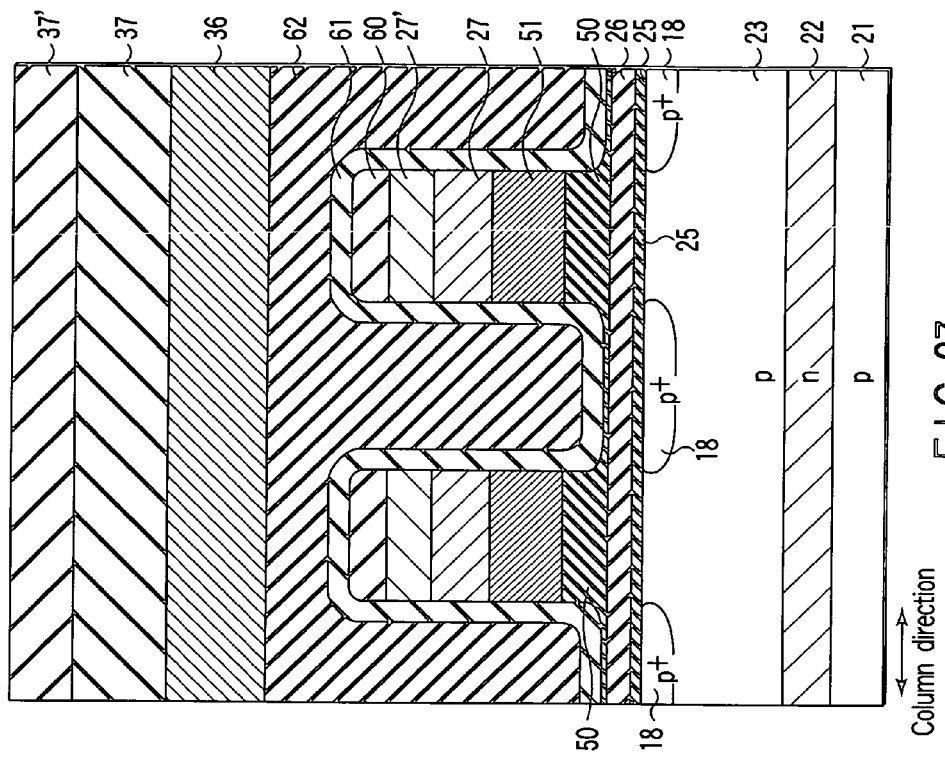
FIG. 27 is a cross sectional view showing an example of the cross section of a memory cell in a column direction which is provided in the data memory system according to the fourth embodiment of this invention.
Figure 26:
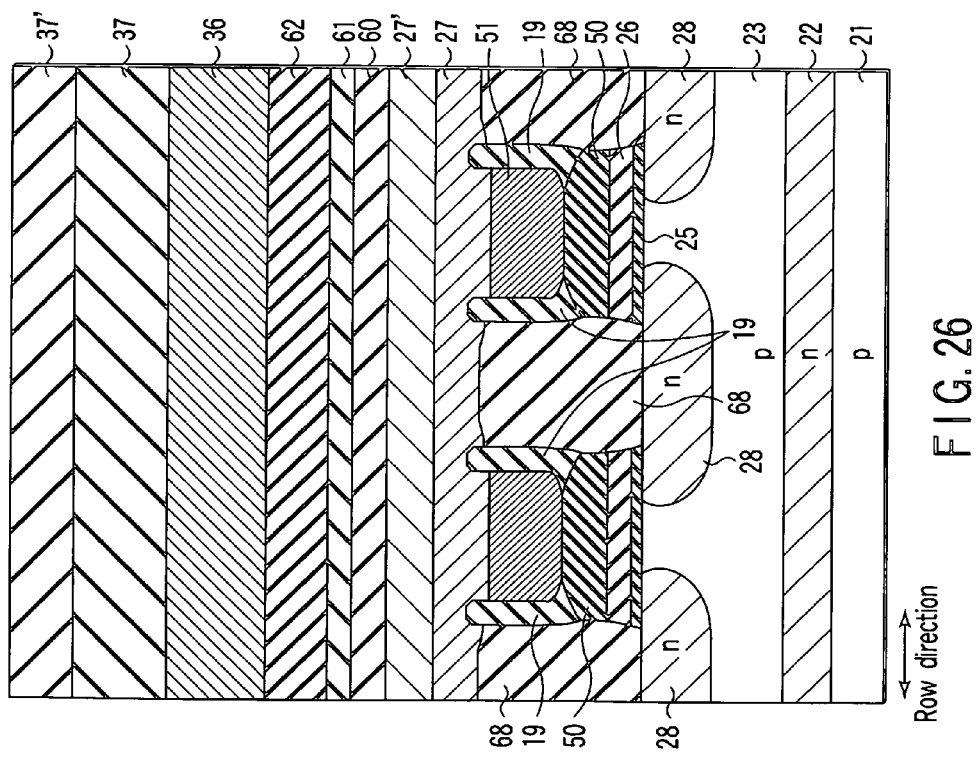
FIG. 26 is a cross sectional view showing an example of the cross section of a memory cell in a row direction which is provided in the data memory system according to the fourth embodiment of this invention.

FIGS. 26, 27 are cross sectional views each showing an example of the cross section of a device according to the fourth embodiment. Like the cross section shown in FIG. 5 in the first embodiment, the cross section shown in FIG. 26 is taken along the row direction, for example, and like the cross section shown in FIG. 6, the cross section shown in FIG. 27 is taken along the column direction perpendicular to the row direction, for example. In FIGS. 26, 27, the cross sections of two memory cells are contained.

As shown in FIGS. 26, 27, the nonvolatile memory cell of this embodiment is an M-NO—S type EEPROM cell or M-ONO—S type EEPROM cell (which is hereinafter referred to as an M-ONO—S type cell). The basic structure thereof is the same as that of the memory cell explained in the third embodiment. Particularly, it is different in that the channel formation direction (corresponding to the channel length direction) of the memory cell coincides with a direction (row direction) in which data selection lines 27, 27' extend.

Further, the memory cell of the present embodiment stores charges in the neighboring portion of a source electrode 28 and in the neighboring portion of a drain electrode 28 to store information of at least two bits for each cell. The two-bit information can be read out according to a direction of voltage applied to the source electrode 28 and drain electrode 28. One example of a known method is disclosed in U.S. Pat. No. 6,201,202, for example. When information is read out by use of the above method, the current terminal of a bit on the side on which information is not read out and the current terminal of a bit on the side on which information is read out are equivalently serially connected. Therefore, the same read disturb stress as that occurring in the NAND cell is applied to the bit on the side on which information is not read out. As a result, the bit on the side on which information is not read out is changed from the erase state to the program state by repeatedly performing the read operation.

As shown in FIGS. 26, 27, first insulating films 25 are formed on a p-type silicon region 23. The p-type silicon region 23 contains boron or indium whose impurity concentration lies in the range of approximately $10^{14}$ cm$^{-3}$ to $10^{19}$ cm$^{-3}$. An example of the first insulating film 25 in this embodiment is a silicon oxynitride film or silicon oxide film having a thickness of 0.5 nm to 10 nm. Charge storage layers 26 are formed on the respective first insulating films 25. An example of the charge storage layers 26 in this embodiment is a silicon nitride film having a thickness of 3 nm to 50 nm. Second insulating films (block insulating films) 50 are formed on the respective charge storage layers 26. An example of the second insulating film 50 is a film of $Al_2O_3$, AlHfO, ZrSiO, HfSiO, ZrSiON or HfSiON, silicon oxide film or oxynitride film having a thickness of 5 nm to 30 nm. Conductive layers 51, 27 are formed on the second insulating films 50. Examples of the conductive films 51, 27 are polysilicon layers, for example. A concrete example of the polysilicon layer is one which has a thickness of 10 nm to 500 nm and contains boron, phosphorus or arsenic with an impurity concentration of $10^{19}$ cm$^{-3}$ to $10^{21}$ cm$^{-3}$. The conductive layer 51 may be formed as required. If the conductive films 51, 27 are formed of polysilicon layers, it is preferable to set the impurity concentration of boron, phosphorus or arsenic contained in the polysilicon layer to $10^{19}$ cm$^{-3}$ or more. Since the control gate can be prevented from being depleted, an electric field applied to the ONO laminated film (second insulating film 50, charge storage layer 26, first insulating film 25) can be made stronger and an increase in erase time or program time can be suppressed. Low-resistance conductive layers 27' are formed on the respective conductive layers 27. One example of the low-resistance conductive layer 27' is a film of WSi, NiSi, MoSi, TiSi, CoSi, W, Al or AlCu having a thickness of 10 nm to 500 nm, for example. The low-resistance conductive layer 27' may be formed as required. In this embodiment, the conductive layers 51, 27 configure the control gate electrode and the low-resistance conductive layer 27' lowers the resistance of the control gate electrode, that is, data selection line. Insulating films 60 are formed on the respective low-resistance conductive layers 27'. An example of the insulating film 60 is a silicon oxide film or silicon nitride film having a thickness of 5 nm to 500 nm. The insulating film 60 functions as a mask when the gate electrodes are formed. The insulating film 60 may be formed as required.

Side wall insulating films 19 are formed on both side walls of each of the gate electrodes. The side wall insulating films 19 in this embodiment are formed to extend from both of the side walls of the cross section in the row direction of the conductive layer 51 into the conductive layer 27. An example of the side wall insulating film 19 is a silicon oxide film or silicon oxynitride film. When the conductive layer 51 is formed of a conductor containing silicon, for example, at least the surface portion of the side wall insulating film 19 of the present embodiment which is formed in contact with the conductive layer is formed by oxidizing or oxidizing-nitriding the conductor 51. Examples of the oxidation method and oxidation-nitriding method are a thermal oxidation method and thermal oxidation-nitriding method. The advantage of this method is that the charge trap density can be set lower, the dielectric breakdown voltage is set higher and the density of the interface state between the conductive layer 51 and the side wall insulating film 19 is set lower in comparison with a deposition film formed by use of a deposition method, for example, CVD method. It is also possible to use a thermal oxide film or thermal oxide-nitride film of higher quality than the deposition film formed by use of the deposition method as the side wall insulating film 19.

As shown in FIG. 26, a case wherein portions of the charge storage layer 26 in the present embodiment which lie above the n-type source/drain regions 28 are selectively removed and inter-level insulating films 68 are formed in the removed portions is shown. The charge storage layer 26 in the present embodiment is an insulator. Therefore, it is not always necessary to remove portions of the charge storage layer 26 which lie above the n-type source/drain regions 28. The charge storage layers 26 can be continuously formed.

The memory cells according to the fourth embodiment are formed by the following procedure.

First, for example, an n-type silicon region 22 is formed in a p-type silicon substrate 21 and a p-type silicon region 23 is formed in the n-type silicon region 22.

Then, a first insulating film 25 is formed on the p-type silicon region 23 and a charge storage layer 26 is formed on the first insulating film 25. Further, a second insulating film 50 is formed on the charge storage layer 26 and a conductive layer 51, for example, a conductive layer 51 containing silicon is formed on the second insulating film 50.

After this, the conductive layer 51, second insulating film 50, charge storage layer 26 and first insulating film 25 are etched, for example, anisotropically etched to selectively remove portions of the conductive layer 51, second insulating film 50, charge storage layer 26 and first insulating film 25. Thus, a plurality of first linear structures which extend in the column direction (in a direction perpendicular to the drawing sheet) and each contain a longitudinal patterned portion of the conductive layer 51, second insulating film 50, charge storage layer 26 and first insulating film 25 are obtained on the p-type silicon region 23.

Then, the surface of the conductive layer 51 is subjected to the oxidation or oxidation-nitriding process, for example, the thermal oxidation or thermal oxidation-nitriding process. Thus, side wall insulating films 19 are formed on the surfaces of each of the conductive layers 51.

Next, n-type impurity such as phosphorus, arsenic or antimony is ion-implanted into the p-type silicon region 23 to a depth of 10 nm to 500 nm with the surface concentration of $10^{17}$ cm$^{-3}$ to $10^{21}$ cm$^{-3}$. As a result, n-type diffusion layers 28 are formed in the p-type silicon region 23. The n-type diffusion layers 28 are used as source regions and drain regions of the memory cells.

Then, an insulator, for example, silicon oxide, silicate glass or inorganic glass is deposited to a thickness of 10 nm to 1000 nm on the exposed surfaces of the first linear structures and p-type silicon region 23 (n-type diffusion layers 28) to form an inter-level insulating film 68.

After this, the upper surface of the inter-level insulating film 68 is etched back by, for example, a CMP (Chemical Mechanical Polishing) process. Thus, the upper surfaces of the inter-level insulating films 68 are made flat.

Next, portions of the side wall insulating films 19 formed on the upper surfaces of the conductive layers 51 are removed, for example, wet-etched by use of an ammonium fluoride solution or the like to expose the upper surfaces of the conductive layers 51.

Then, a conductor, for example, conductive polysilicon or SiGe mixed crystal is deposited to a thickness of 10 nm to 300 nm on the conductive layers 51 and inter-level insulating films 68 to form a conductive layer 27. Further, when a conductive impurity, for example, boron, phosphorus or arsenic is doped into the conductive layer 27 and if the impurity concentration is set equal to or higher than $10^{19}$ cm$^{-3}$, an electric field applied to the ONO laminated film (second insulating film 50, charge storage layer 26, first insulating film 25) can be made stronger and an increase in erase time or program time can be suppressed.

Next, a conductor having lower resistance than the conductive layer 27, for example, WSi, NiSi, MoSi, TiSi, CoSi, W, Al or AlCu is deposited on the conductive layer 27 to form a low-resistance conductive layer 27'.

After this, a mask material, for example, silicon nitride or silicon oxide is deposited on the low-resistance conductive layer 27' to form an insulating film 60.

Next, the insulating film 60, low-resistance conductive layer 27', conductive layer 27, conductive layers 51, side wall insulating films 19, second insulating films 50, charge storage layers 26 and first insulating films 25 are etched, for example, anisotropically etched to selectively remove portions thereof. Thus, a plurality of second linear structures which extend in the row direction (in a horizontal direction on the drawing sheet) and each contain patterned portions of the insulating film 60, low-resistance conductive layer 27', conductive layer 27, conductive layers 51, side wall insulating films 19, second insulating films 50, charge storage layers 26 and first insulating films 25 are obtained on the p-type silicon region 23. In this process, the memory cells are individually divided in the row and column directions.

Next, a p-type impurity such as boron, boron fluoride (BF$_2$) or indium is ion-implanted into the p-type silicon region 23 to a depth of 10 nm to 500 nm with the surface concentration of $10^{16}$ cm$^{-3}$ to $10^{18}$ cm$^{-3}$. As a result, high-concentration p-type diffusion layers 18 with an impurity concentration higher than the p-type silicon region 23 are formed in the p-type silicon region 23. The high-concentration p-type diffusion layers 18 are used as layers which prevent leakage currents from flowing between channels of the memory cells adjacent in the column direction. The high-concentration p-type diffusion layers 18 may be provided as required.

Then, an insulator, for example, silicon nitride, silicon oxide-nitride or alumina is deposited to a thickness of 5 nm to 200 nm on the exposed surfaces of the second linear structures and p-type silicon region 23 (n-type diffusion layers 28, high-concentration p-type diffusion layers 18) to form an insulating film 61. The insulating film 61 is a deposited insulating film formed by a CVD (Chemical Vapor Deposition) method or sputtering method, for example. If the insulating film 61 is deposited on the memory cell, all of the memory cells or the entire surface of the memory cell array, an advantage that gas, radical or ions emitted from films formed on or above the insulating film 61 can be suppressed from giving a bad influence on the memory cells can be attained.

Next, silicate glass such as BPSG, PSG or BSG is deposited to a thickness of 10 nm to 1000 nm on the insulating film 61 to form an inter-level insulating film 62. For example, BPSG, PSG or BSG contains boron or phosphorus of $1 \times 10^{20}$ cm$^{-3}$ or more. Silicate glass has a function of gettering alkali ions. Therefore, if the inter-level insulating film 62 is deposited and formed on the memory cell, all of the memory cells or the entire surface of the memory cell array, an advantage that contamination by alkali ions can be suppressed can be obtained.

In this embodiment, the inter-level insulating film 62 is formed in direct contact with the insulating film 61. However, it is not necessarily formed in contact with the insulating film 61. For example, if the inter-level insulating film 62 is formed as an insulating film between the wiring layers or an insulating film on the wiring layer, the gettering effect can be attained and there occurs no problem.

The burying property of silicate glass immediately after deposition is generally bad. Therefore, for example, if the annealing process is performed at temperatures of 750° C. to 1000° C. for two minutes to 120 minutes after deposition, a viscous flow occurs and the surface is made flat. At the annealing time, hydronium ion or water contained in silicate glass is liberated. For example, water oxidizes the gate end of the memory cell. Therefore, for example, the film thickness of the second insulating film 50 increases and the gate shape is changed. However, if the insulating film 61 is formed, for example, water can be shielded and an advantage that a variation in the gate shape can be suppressed can be attained.

As the inter-level insulating film 62, for example, inorganic glass formed by use of cyclopentasilane or polysilazane can be used. In this case, an oxidation process for converting cyclopentasilane or polysilazane into inorganic glass is necessary. Like water, an oxidizing agent changes the gate shape. However, if the insulating film 61 is formed, for example, the oxidizing agent is shielded and, as a result, an advantage that a variation in the gate shape can be suppressed can be attained. As described above, if the insulating film 61 is formed, for example, it is advantageous when fine memory cells are integrated.

As the inter-level insulating film 62, for example, a laminated structure of a silicon oxide film formed by use of TEOS or HDP and another insulating film such as HSQ can be used.

Next, upper wirings 36 are formed on the inter-level insulating film 62. The upper wirings 36 are various wirings formed in the semiconductor integrated circuit device. For example, the upper wirings 36 are variously changed according to applications of the semiconductor integrated circuit device. Therefore, in this embodiment, the concrete shape of the upper wiring 36 is not shown in detail and it is only shown in the drawing that the upper wiring 36 is formed on the inter-level insulating film 62. For example, in FIGS. 26, 27, the upper wiring 36 is shown as if it is "a sheet of plate". The upper wiring 36 is shown as a single-layered structure, but it can be formed as a two- or multi-layered structure.

Next, an insulator such as HSQ or silicon oxide formed by use of TEOS or HDP is deposited to form an inter-level insulating film 37 on the upper wirings 36 and inter-level insulating film 62.

After this, silicon nitride is deposited on the inter-level insulating film 37 to a thickness of 20 nm to 1 μm by use of a plasma chemical vapor deposition method to form a silicon nitride film 37'. The silicon nitride film 37' has a function of blocking water diffused from the exterior of the chip (upper portion of the semiconductor integrated circuit device).

According to the fourth embodiment, the following features and effects can be attained in addition to the features and effects obtained in the above embodiments.

(12) The conductive layers 27 (control gates) 27 are formed to extend in a direction (in the row direction or in the horizontal direction on the drawing sheet of FIG. 26) intersecting at, for example, right angles with respect to a direction (in the column direction or in the direction perpendicular to the drawing sheet of FIG. 26) in which the n-type diffusion layers (source regions and drain regions) 28 are formed to extend. The memory cells are connected in parallel between corresponding adjacent two of the n-type diffusion layers (source regions and drain regions) 28. As the EEPROM having the above connection state, for example, a virtual ground array type memory is provided. In a semiconductor memory having the memory cells connected in parallel between corresponding adjacent two of the n-type diffusion layers, the resistance of a series-connected resistors of the memory cell block can be suppressed to a small value and can be made constant. Therefore, the semiconductor memory is advantageous in stabilizing the threshold values of the memory cells and can be effectively used as a multi-value memory in which the width of the threshold voltage distribution is narrow, for example.

The inter-level insulating layers (element isolation regions) 68 and the n-type diffusion layers 28 are formed in self-alignment manner with respect to the charge storage layers 26. It is not necessary for the inter-level insulating layers 68 and the n-type diffusion layers 28 to have an alignment margin with respect to the charge storage layers 26. Further, the inter-level insulating layers 68 are formed on the n-type diffusion layers 28. Therefore, the integration density of the memory cells can be made higher in comparison with those of a semiconductor memory having element isolation regions formed between memory cells and a semiconductor memory having the charge storage layers 26 formed on the element isolation regions.

The features and effects of the memory cell array of the semiconductor memory having the memory cells connected between the n-type diffusion layers are also described in Jpn. Pat. Appln. KOKAI Publication No. 2002-150783 which is a prior application by the inventor of this application, for example.

(13) The memory cell is an M-ONO—S type cell. Therefore, like the third embodiment, the program voltage and erase voltage can be lowered, the element isolation interval can be reduced and the dielectric breakdown voltage can be kept sufficiently high even when the gate insulating film is made thin in comparison with the floating gate type cell. Therefore, the area of a circuit applied with high voltage can be reduced and the chip area can be easily reduced.

Like the third embodiment, since the thickness of the charge storage layer 26 can be made thin, the aspect ratio of the gate structure can be made small and the size-controllability of the gate structure can be enhanced in comparison with the floating gate type cell. The burying property of the inter-level insulating film 68 into between the gate structures is enhanced and the dielectric breakdown voltage can be enhanced.

Like the third embodiment, since the process for forming floating gates can be omitted or simplified, time required for the manufacturing process can be reduced in comparison with the floating gate type cell.

Like the third embodiment, since charges can be trapped in the charge trap, the charge holding characteristic can be enhanced in comparison with the floating gate type cell. For example, it becomes possible to attain high resistance to radioactive rays.

As described above, according to the embodiments of the present invention, a data memory system which can further reduce the rate of occurrence of faulty bits as viewed from the external interface can be provided.

The present invention has been explained by using several embodiments, but this invention is not limited to the above embodiments. When embodying the invention, the invention can be variously modified without departing from the technical scope thereof.

For example, as the method for forming the insulating films such as the inter-level insulating films and element isolation regions, a method other than the method for forming silicon into silicon oxide films or silicon nitride films can be used. For example, a method for injecting oxygen ions into deposited silicon or a method for oxidizing deposited silicon can be used.

The charge storage layer 26 may be formed of $TiO_2$, $Al_2O_3$, AlHfO, tantalum oxide film, strontium titanate, barium titanate, and lead titanate zirconium. Further, it can be formed of a laminated film obtained by laminating the above material films.

The semiconductor substrate is not limited to p-type silicon, but a substrate containing silicon such as n-type silicon, SOI silicon layer formed on the SOI substrate, SiGe mixed crystal or SiGeC mixed crystal, for example, a single crystal substrate can be used. Of course, it is possible to use semiconductor other than silicon.

As the memory cell, an n-channel MOSFET (n-channel floating gate type cell, n-channel M-NO—S type cell, n-channel M-ONO—S type cell) is used. However, it is possible to use a p-channel MOSFET (p-channel floating gate type cell, p-channel M-NO—S type cell, p-channel M-ONO—S type cell). In this case, the conductivity types of the semiconductor regions of the above embodiments may be changed from the n type to the p type and from the p type to the n type. Further, as the conductive impurity, indium or boron may be used instead of arsenic, phosphorus or antimony.

The conductive layers (control gates) 27, 51 can be formed of SiGe mixed crystal or SiGeC mixed crystal or may be formed of a laminated structure obtained by laminating the above material films. Further, the above materials may be polycrystalline, amorphous or single crystalline materials. It is also possible to laminate layers of different crystallinities formed of the polycrystalline, amorphous and single crystalline materials. If the conductive layers (control gates) 27, 51 are formed of semiconductor, particularly, semiconductor containing silicon, for example, preferable side wall insulating films 19 as described in the fourth embodiment can be obtained. This is because the side wall insulating films 19 can be formed by subjecting semiconductor containing silicon to the oxidizing or oxidizing-nitriding process.

The charge storage layers 26 can be separated in regions between the source regions and the drain regions or formed in a dot pattern.

For example, as the low-resistance conductive layer 27', silicide formed by reacting metal such as Ti, Co, Ni, Mo, Pd or Pt with the conductive layer 27, for example, the conductive layer 27 containing silicon may be used.

In the above embodiments, an example of the memory cells each storing binary values is shown, but memory cells each storing three or more digital values as a plurality of threshold voltages can be used. This is a so-called multi-level threshold voltage memory. With the multi-level threshold voltage memory, the width of distribution of threshold voltages corresponding to information is narrow and the separation interval between the threshold voltage distributions is also narrow in comparison with the binary-level threshold voltage memory. Therefore, faulty bits tend to occur in the multi-level threshold voltage memory in comparison with the binary-level threshold voltage memory. That is, the advantage of the above embodiments can be more effectively attained in the multi-level threshold voltage memory. Therefore, the above embodiments can be effectively used for the multi-level threshold voltage memory. Further, if the number of information items stored in one memory cell is $2^n$, then the advantage that the process for decoding information data can be simplified can be attained.

The above embodiments show the example of the nonvolatile semiconductor memory. However, the above embodiments can be applied to a semiconductor memory including data selection lines commonly used by memory cells, memory cell blocks from which data items are selectively read out in parallel by use of a corresponding one of the data selection lines, a circuit which corrects an error bit of the parallel readout data by use of ECC, and spare memory cell blocks having data selection lines commonly used by the memory cells. In this case, for example, a case wherein the error bit is caused by deterioration with time, electro-migration and collusion may be considered and the error bit rate can be significantly improved. As the memory cells, any type of memory cells such as DRAM cells, SRAM cells, FeRAM cells or MRAM cells can be used.

Further, the above embodiments can be independently performed, but they can be adequately combined and performed.

The above embodiments contain inventions at various stages and the inventions at the various stages can be extracted by adequately combining a plurality of constituents disclosed in the above embodiments.

Further, the above embodiments are explained based on an example in which this invention is applied to the semiconductor memory. However, this invention is not limited to the semiconductor memory and a semiconductor integrated circuit device containing the semiconductor memory, fore example, a processor, system LSI or the like can be contained in the technical scope of this invention.

According to the embodiments, the faulty bit rate as viewed from the external interface can be significantly reduced without increasing the number of check bits of the ECC circuit. Particularly, by previously preparing a certain number of or more memory areas among the vacant memory areas as the spare memory areas, the faulty bit rate as viewed from the external interface can be rapidly suppressed while the data memory area which the user can use is ensured until the end of the service lifetime.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data memory system comprising:
a non-spare area having a plurality of memory cell blocks and containing pages;
a spare area having a plurality of spare memory cell blocks in which data items are previously set to a certain value and containing pages; and
a determination circuit which detects a data error of at least two bits when data is read out from the page of the non-spare area and determines a number of error bits in the readout page for each readout page,
wherein contents of the readout page are error-corrected and programmed into the page of the spare area when the result of determination by the determination circuit indicates the number of error bits not less than two.

2. The system according to claim 1, wherein the number of memory cells in one page is not less than (n+t×m) where the number of information bits for each page is n, the maximum number of bits which can be corrected in one page is t and m is a natural number in a range of $\{2^{m-1}-t\times(m-1)-1\}$ to $(2^m-t\times m-1)$.

3. The system according to claim 1, wherein the erase operation is simultaneously performed for a plurality of pages of the non-spare area and the spare area.

4. The system according to claim 1, wherein memory cells contained in the memory cell blocks and memory cells contained in the spare memory cell blocks have charge storage layers and store information according to amounts of charges stored in the charge storage layers and the memory cells include memory cells of NAND structures whose current terminals are serially connected.

5. The system according to claim 1, wherein the guaranteed number of faulty blocks after a specified maximum number of program and erase operations or at the end time of the product guarantee lifetime is "0".

6. A data memory system comprising:
a non-spare area having $n_{block}$ memory cell blocks and containing pages;
a spare area having $n_{replace}$ spare memory cell blocks in which data items are previously set to a certain value and containing pages; and
an error correction circuit which corrects errors of ECC bits at maximum for each page,
wherein the ECC bits are not less than two bits and the following equations [1] and [2] are obtained when the maximum guaranteed value of the number of the memory cell blocks required to be replaced after a specified maximum number of program and erase operations or at the end time of the product guarantee lifetime is set to $n_{bad}$, $$n_{bad} = n_{block} \times \sum_{i=ECC+1}^{\infty} \frac{a^i}{i!} \quad \text{(equation [1])}$$

$$n_{replace} \geq n_{block} \times \frac{a^{ECC}}{(ECC)!} \quad \text{(equation [2])}$$

the number $n_{replace}$ of the spare memory cell blocks is set to satisfy the equations [1], [2] ("a" is a variable which can be eliminated by simultaneously establishing the equations [1] and [2]), and contents of the page in which an error bit occurs are error-corrected and programmed into the page of the spare area when the error bit occurs in the page of the non-spare area.

7. The system according to claim 6, wherein the number of memory cells in one page is not less than (n+t×m) where the number of information bits for each page is n, the maximum number of bits which can be corrected in one page is t and m is a natural number in a range of $\{2^{m-1}-t\times(m-1)-1\}$ to $(2^m-t\times m-1)$.

8. The system according to claim 6, wherein the erase operation is simultaneously performed for a plurality of pages of the non-spare area and the spare area.

9. The system according to claim 6, wherein memory cells contained in the memory cell blocks and memory cells contained in the spare memory cell blocks are semiconductor memory cell transistors which store digital values of at lest three values as a plurality of threshold voltages.

10. The system according to claim 6, wherein memory cells contained in the memory cell blocks and memory cells contained in the spare memory cell blocks have charge storage layers and store information according to amounts of charges stored in the charge storage layers and the memory cells include memory cells of NAND structures whose current terminals are serially connected.

11. The system according to claim 6, wherein memory cells contained in the memory cell blocks are commonly connected to a first data selection line to configure a page, and wherein memory cells contained in the spare memory cell blocks are commonly connected to a data second selection line to configure a page.

12. The system according to claim 6, wherein memory cells contained in the memory cell blocks and memory cells contained in the spare memory cell blocks have charge storage layers and store information according to amounts of charges stored in the charge storage layers and the memory cells include memory cells of structures whose current terminals are connected in parallel.

13. A data memory system comprising:
a non-spare area having a plurality of memory cell blocks which store binary digital data indicating at least a program state and erase state and containing pages;
a spare area having a plurality of spare memory cell blocks which store binary digital data indicating at least a program state and erase state and in which data items are previously set to a certain value and containing pages; and
an error correction code circuit which receives a digital data output from the page of the memory cell block and detects a data error of at least two bits,
wherein block addresses of the non-spare area are successively set and block addresses of the spare area are set to contain program state bits of a number larger than a number of erase state bits.

14. The system according to claim 13, wherein the number of memory cells in one page is not less than (n'×m) where the number of information bits for each page is n, the maximum number of bits which can be corrected in one page is t and m is a natural number in a range of $\{2^{m-1}-t\times(m-1)-1\}$ to $(2^{m}-t\times m-1)$.

15. The system according to claim 13, wherein the erase operation is simultaneously performed for a plurality of pages of the non-spare area and the spare area.

16. The system according to claim 13, wherein memory cells contained in the memory cell blocks and memory cells contained in the spare memory cell blocks are semiconductor memory cell transistors which store digital values of at lest three values as a plurality of threshold voltages.

17. The system according to claim 13, wherein memory cells contained in the memory cell blocks and memory cells contained in the spare memory cell blocks have charge storage layers and store information according to amounts of charges stored in the charge storage layers and the memory cells include memory cells of NAND structures whose current terminals are serially connected.

18. The system according to claim 13, wherein block addresses of the spare area contain a block address in which all of the bits are set to the program state bit.

19. The system according to claim 13, wherein memory cells contained in the memory cell blocks are commonly connected to a first data selection line to configure a page, and wherein memory cells contained in the spare memory cell blocks are commonly connected to a data second selection line to configure a page.

20. The system according to claim 13, wherein memory cells contained in the memory cell blocks and memory cells contained in the spare memory cell blocks have charge storage layers and store information according to amounts of charges stored in the charge storage layers and the memory cells include memory cells of structures whose current terminals are connected in parallel.

* * * * *